United States Patent
Ford et al.

(10) Patent No.: US 9,274,266 B2
(45) Date of Patent: Mar. 1, 2016

(54) SYSTEM AND METHOD FOR SOLAR ENERGY CAPTURE AND RELATED METHOD OF MANUFACTURING

(75) Inventors: Joseph E. Ford, Solana Beach, CA (US); Jason Harris Karp, La Jolla, CA (US); Eric Tremblay, British Columbia (CA); Justin Matthew Hallas, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 770 days.

(21) Appl. No.: 13/119,955

(22) PCT Filed: Sep. 18, 2009

(86) PCT No.: PCT/US2009/057567
§ 371 (c)(1),
(2), (4) Date: Jun. 3, 2011

(87) PCT Pub. No.: WO2010/033859
PCT Pub. Date: Mar. 25, 2010

(65) Prior Publication Data
US 2011/0226332 A1 Sep. 22, 2011

Related U.S. Application Data

(60) Provisional application No. 61/098,279, filed on Sep. 19, 2008.

(51) Int. Cl.
*F21V 8/00* (2006.01)
*F24J 2/06* (2006.01)
(Continued)

(52) U.S. Cl.
CPC ............. *G02B 6/0078* (2013.01); *F24J 2/067* (2013.01); *F24J 2/085* (2013.01); *G02B 6/0038* (2013.01);
(Continued)

(58) Field of Classification Search
CPC .................................................. H01P 1/2002
See application file for complete search history.

(56) References Cited

U.S. PATENT DOCUMENTS

| 4,110,123 A | 8/1978 | Goetzberger et al. |
| 4,149,902 A | 4/1979 | Mauer et al. |

(Continued)

FOREIGN PATENT DOCUMENTS

| CN | 101138101 | 3/2008 |
| EP | 0141868 A1 | 5/1985 |

(Continued)

OTHER PUBLICATIONS

"EMCORE T1000 Cell—Triple-Junction High-Efficiency Solar Cells for Terrestrial Concentrated Photovoltaic Applications," Product Brief 2006, obtained online May 31, 2012, <<http://www.emcore.com/assets/photovoltaics/T1000%20Data%20Sheet%20March%2007.pdf>>.

(Continued)

*Primary Examiner* — Jennifer Michener
*Assistant Examiner* — Christopher Danicic
(74) *Attorney, Agent, or Firm* — Perkins Coie LLP

(57) ABSTRACT

A system and method of capturing solar energy, and related method of manufacturing, are disclosed. In at least one embodiment, the system includes a first lens array having a plurality of lenses, and a first waveguide component adjacent to the lens array, where the waveguide component receives light, and where the waveguide component includes an array of prism/mirrored facets arranged along at least one surface of the waveguide component. The system further includes at least one photovoltaic cell positioned so as to receive at least a portion of the light that is directed out of the waveguide. A least some of the light passing into the waveguide component is restricted from leaving the waveguide component upon being reflected by at least one of the prism/mirrored facets, hereby the at least some light restricted from leaving the waveguide component is directed by the waveguide toward the at least one photovoltaic cell.

36 Claims, 21 Drawing Sheets

(51) Int. Cl.
  *F24J 2/08* (2006.01)
  *H01L 31/054* (2014.01)
  *G02B 3/00* (2006.01)

(52) U.S. Cl.
  CPC .......... *G02B 6/0053* (2013.01); *H01L 31/0543* (2014.12); *H01L 31/0547* (2014.12); *G02B 3/0056* (2013.01); *Y02B 10/12* (2013.01); *Y02B 10/20* (2013.01); *Y02E 10/43* (2013.01); *Y02E 10/52* (2013.01)

(56) References Cited

U.S. PATENT DOCUMENTS

| | | | |
|---|---|---|---|
| 4,281,294 A | 7/1981 | Volkin | |
| 4,292,959 A | 10/1981 | Coburn, Jr. | |
| 4,297,521 A | 10/1981 | Johnson | |
| 4,411,490 A | 10/1983 | Daniel | |
| 4,461,278 A | 7/1984 | Mori | |
| 4,723,826 A * | 2/1988 | Whitaker | 126/576 |
| 4,902,089 A | 2/1990 | Mori | |
| 5,022,736 A | 6/1991 | Mori | |
| 5,581,408 A | 12/1996 | Schumtz et al. | |
| 6,229,651 B1 * | 5/2001 | Edlinger | 359/583 |
| 7,391,939 B1 * | 6/2008 | Williams | 385/31 |
| 2005/0195465 A1 * | 9/2005 | Rabinowitz | 359/291 |
| 2006/0185713 A1 | 8/2006 | Mook | |
| 2007/0125415 A1 | 6/2007 | Sachs | |
| 2008/0223443 A1 | 9/2008 | Benitez et al. | |
| 2009/0064993 A1 * | 3/2009 | Ghosh et al. | 126/685 |
| 2009/0199889 A1 | 8/2009 | Willmott | |
| 2010/0032005 A1 | 2/2010 | Ford et al. | |
| 2010/0200044 A1 * | 8/2010 | Zaban et al. | 136/246 |

FOREIGN PATENT DOCUMENTS

| | | | |
|---|---|---|---|
| EP | 0848432 A2 | 6/1998 | |
| JP | 02-197005 | 8/1990 | |
| JP | 02-197005 A | 8/1990 | |
| JP | 11-340493 | 12/1999 | |
| JP | 2004-047753 | 2/2004 | |
| WO | 00/74147 | 12/2000 | |
| WO | 2006/088370 | 8/2006 | |
| WO | WO 2007/138589 | * 12/2007 | .......... H01L 31/0232 |
| WO | 2008/091290 | 7/2008 | |
| WO | 2008/131561 | 11/2008 | |

OTHER PUBLICATIONS

Barnett, A., et al, "50% Efficient Solar Cell Architectures and Designs," IEEE Conference Record of the 2006 IEEE 4th World Conference on Photovoltaic Energy Conversion, vol. 2, pp. 2560-2564, May 2006.

Barnett, A., et al, "Milestones Toward 50% Efficient Solar Cells," 22nd European Photovoltaic Solar Energy Conference, Milan Italy, Paper 1AO.6.7, pp. 95-100, Sep. 2007.

Campbell, P., et al., "The Limiting Efficiency of Silicon Solar Cells under Concentrated Sunlight," IEEE Transactions on Electron Devices, 33(2):234-239, Feb. 1986.

Chan, T.K., et al., "1092 Channel 2-D Array Demultiplexer for Ultralarge Data Bandwidth," IEEE Journal of Lightwave Technology, 25(3):719-725, Mar. 2007.

Chan, T.K., et al., "Retroreflecting Optical Modulator Using a MEMS Deformable Micromirror Array," IEEE Journal of Lightwave Technology, 24(1):516-525, Jan. 2006.

Chiou, P.Y., et al., "Massively parallel manipulation of single cells and microparticles using optical images," Nature, vol. 436, pp. 370-372, Jul. 2005.

Currie, M.J., et al., "High-Efficiency Organic Solar Concentrators for Photovoltaics," Science, 321(5886):226-228, Jul. 2008.

Efron, U., et al., "The silicon liquid-crystal light valve," Journal of Applied Physics, 57(4):1356-1368, Feb. 1985.

Energy Information Administration (EIA), "Solar Thermal and Photovoltaic Collector Manufacturing Activities 2006," 41 pages, Oct. 2007.

Ford, J.E., et al., "Dynamic Spectral Power Equalization Using Micro-Opto-Mechanics," IEEE Photonics Technology Letters, 10(10):1440-1442, Oct. 1998.

Ford, J.E., et al., "Wavelength Add/Drop Switching Using Tilting Micromirrors," IEEE Journal of Lightwave Technology, 17(5):904-911, May 1999.

Garboushian, V., et al., "Integrated high-concentration PV near-term alternative for low-cost large-scale solar electric power," Solar Energy Materials and Solar Cells, 47(1-4):315-323, Oct. 1997.

Goetzberger, A., et al., "Solar energy conversion with fluorescent collectors," Applied Physics, 14:123-139, Oct. 1977.

Green, M., et al., "Solar Cell Efficiency Tables (version 22)," Progress in Photovoltaics: Research and Applications, 11(5):347-352, Aug. 2003.

Im, C., et al., "Photoconduction in organic donor-acceptor systems," Journal of Chemical Physics, 119(7):3952-3957, Aug. 2003.

Karp, J.H., et al., "Planar micro-optic solar concentration using multiple imaging lenses into a common slab waveguide," Proceedings of SPIE, High and Low Concentrator Systems for Solar Electric Applications IV, 7407 (1):74070D(1)-74070D(11), Aug. 2009.

King, R., "Multijunction Cells: Record Breakers," Nature Photonics, 2(5):284-286, May 2008.

Tremblay, E.J., et al., "Ultrathin cameras using annular folded optics," Applied Optics, 46(4):463-471, Feb. 2007.

Viravathana, P., et al., "Optical Trapping of Titania/Silica Core-Shell Colloidal Particles," Journal of Colloid and Interface Science, 221(2):301-307, Jan. 2000.

Watson, E.A., "Analysis of beam steering with decentered microlens arrays," Optical Engineering, 32(11):2665-2670, Nov. 1993.

Yoshida, M., et al., "$TiO_2$ nano-particle-dispersed polyimide composite optical waveguide materials through reverse micelles," Journal of Materials Science, 32(15):4047-4051, Aug. 1997.

Zanzucchi, P.J., et al., "Optical and photoconductive properties of discharge-produced amorphous silicon," Journal of Applied Physics, 48(12):5227-5236, Dec. 1977.

Office Action for Chinese Patent Application No. 200980146342.1, mailed on Jul. 17, 2012 (6 pages).

International Search Report and Written Opinion mailed on May 3, 2010 for International Application No. PCT/US2009/057567, filed Sep. 18, 2009 (11 pages).

* cited by examiner

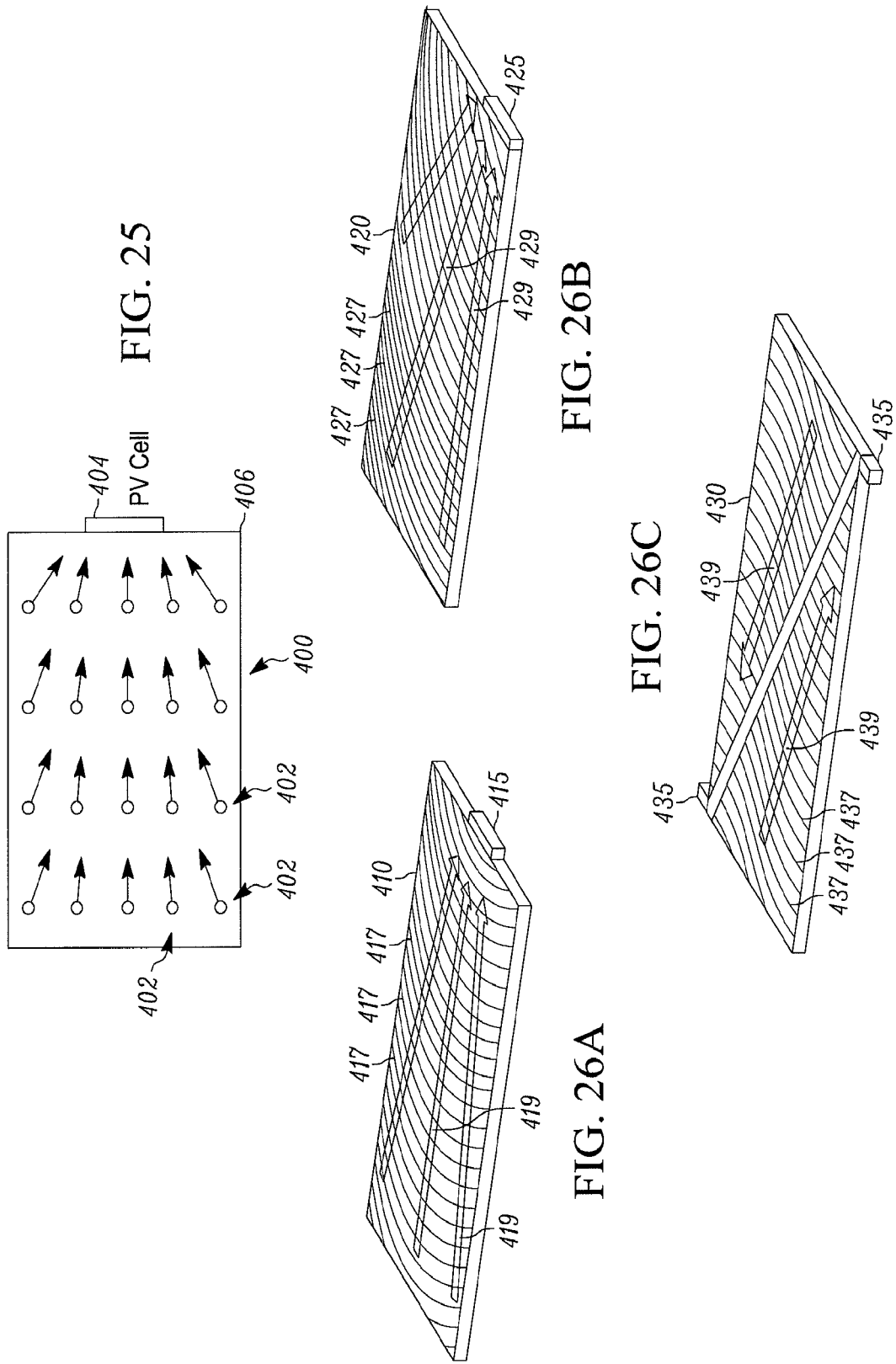

SYSTEM AND METHOD FOR SOLAR ENERGY CAPTURE AND RELATED METHOD OF MANUFACTURING

CROSS-REFERENCE TO RELATED APPLICATIONS

This application claims the benefit of U.S. provisional patent application No. 61/098,279 entitled "System and Method for Solar Energy Capture and Related Method of Manufacturing" and filed on. Sep. 19, 2008, which is hereby incorporated by reference herein.

STATEMENT REGARDING FEDERALLY SPONSORED RESEARCH OR DEVELOPMENT

--

FIELD OF THE INVENTION

The present invention relates to solar energy systems, and methods and, more particularly, to systems and methods for capturing solar energy that operate at least in part by way of concentrating received light prior to conversion of the light into electrical or other power, as well as to methods of manufacturing such systems.

BACKGROUND OF THE INVENTION

Solar energy systems are of greatly increased interest due to rising energy demands worldwide and consequent rising prices for existing energy resources, especially petroleum resources. While much effort is being focused upon developing more efficient photovoltaic (PV) cells that can generate ever greater amounts of electrical energy based upon a given amount of solar radiation directed upon those cells, high efficiency PV cells nevertheless remain expensive. A less-expensive alternative to employing high efficiency PV cells is to employ low (or lower) efficiency PV cells. However, such PV cells need to be implemented across larger surface areas in order to collect sufficient solar radiation so as to generate the same amount of energy as can developed using high efficiency PV cells having a smaller surface area.

Although the efficiency of a PV-based solar energy system depends upon the efficiency of the PV cell(s) employed in that system, the amount of energy generated by such a system can also be enhanced without increasing the efficiency of the PV cell(s) or larger area PV cell(s) by combining the use of PV cell(s) with additional devices that concentrate the solar radiation prior to directing it upon the PV cell(s). Because such solar concentration devices can employ components that are less expensive than the PV cell(s) themselves, a solar energy system employing such a solar concentration device in combination with PV cell(s) covering a relatively small surface area can potentially produce, at a lower cost, the same high level of energy output as that achieved by a solar energy system employing only PV cell(s) of the same or greater area. Also, a solar energy system employing such a solar concentration device in addition to high efficiency PV cell(s) covering a relatively small area can achieve higher levels of energy output than would be possible using those PV cell(s) alone, even if those cells covered a large area.

While potentially providing such advantages, existing solar energy systems employing both PV cell(s) and solar concentration devices have certain disadvantages as well. In particular, some stationary solar concentration devices tend to be not very efficient. For example, one particular type of existing solar energy system employing both PV cell(s) and solar concentration devices is a system employing one or more fluorescent solar concentrators (FSCs). In such a device, light incident on the surface of a slab waveguide is absorbed by an atomic or molecular transition of material embedded in the slab. Upon absorption, some of the energy is then emitted as fluorescence uniformly in all directions, and this fluorescent light is emitted at a longer wavelength with less energy than the incident light. While a fraction of the emitted fluorescence is trapped within the slab, and guided to an edge of the waveguide for illumination of a PV cell, a large fraction of the fluorescent light is re-absorbed and re-emitted into a non-guided direction, thus resulting in substantial inefficiency.

An additional problem associated with some conventional solar concentrators (e.g., imaging lens or mirror-based concentrators) is that, for proper operation, such solar concentrators require sunlight that is incident from a particular direction relative to the concentrator. That is, while such solar concentrators are able to condense/magnify light incident over a large area onto a smaller area PV cell, such large magnifications require precise alignment that must be maintained as the sun moves through the sky through the daily arc, and through the seasonal variation of elevation. Although it is possible to achieve such alignment by way of an "active" system that uses tracking (with or without positional feedback, such active systems are expensive and often complicated to implement. The alternative, "passive" systems, which do not use active alignment, can achieve only a relatively small concentration factor (e.g., of approximately 10 suns), depending on the range of angles over which the concentrator is designed to maintain relatively high throughput efficiency.

Still another disadvantage associated with at least some conventional solar energy systems employing solar concentrators is that they are complicated and/or expensive to manufacture.

It would therefore be advantageous if an improved design for a solar energy system employing both PV cell(s) and solar concentration devices could be developed. More particularly, it would be advantageous if such an improved design allowed for one to achieve one or more of the benefits of conventional solar energy systems employing both PV cell(s) and solar concentration devices, while not suffering from (or suffering as much from) one or more of the above-described disadvantages of such systems.

SUMMARY OF THE INVENTION

The present inventors have recognized the desirability solar energy systems employing PV cells in addition to solar concentrators, and further recognized that existing systems employing fluorescent solar concentrators (FSCs) are advantageous in that, insofar as they employ slab waveguides, such systems can be more compact than many other forms of solar energy systems that employ other forms of solar concentrators. Additionally, however, the inventors have further recognized that a new form of solar energy system employing slab waveguides can be achieved having higher efficiency than existing systems if, instead of employing FSCs, the solar concentrators instead are built by placing a lens array adjacent to a slab waveguide formed between a low index cladding layer and an additional layer having prism facets, with the lens array being along the cladding layer opposite the additional layer of the slab waveguide having the prism facets. By appropriate design of the prism facets, total internal reflection can be achieved within the slab waveguide with respect to much if not all incoming light directed into the slab waveguide, and this light can in turn be directed to one or more PV cells positioned at one more ends/edges of the slab waveguide.

Additionally, the present inventors have also recognized the desirability of solar energy systems that are capable of receiving light from changing angles of incidence. Consequently, while prism facets with constant optical properties can be employed in at least some embodiments of the present invention, the present inventors have further recognized that in at least some other embodiments of the present invention the prism facets can be formed or revealed by way of one or more materials and/or processes that allow for the prism facet characteristics to vary, including location relative to the microlens, depending upon the light incident upon those prism facets. Also, in at least some other embodiments, components of the solar energy systems can be shifted slightly in various manners to also allow light of various angles of incidence to be received and directed to PV cells. In some such embodiments, the waveguide with the prism facets can be shifted relative to one or more lens devices. Further, the present inventors have also recognized the desirability of increasing the degree to which light is concentrated onto less numbers of (or smaller) PV cells, as well as the desirability of being able to receive multiple light components rather than merely a single light component or single range of light components, and have further developed various arrangements that facilitate achieving such objectives.

In at least one embodiment, the present invention relates to a system for capturing solar energy. The system includes a first lens array having a plurality of lenses, and a first waveguide component adjacent to the lens array, where the waveguide component receives light, and where the waveguide component includes an array of prism or mirrored facets (or other light-directing feature) arranged along at least one surface of the waveguide component. The system further includes at least one photovoltaic cell positioned so as to receive at least a portion of the light that is directed out of the waveguide. At least some of the light passing into the waveguide component is restricted from leaving the waveguide component upon being reflected by at least one of the prism or mirrored facets, whereby the at least some light restricted from leaving the waveguide component is directed by the vvaveguide toward the at least one photovoltaic cell.

Further, in at least one embodiment, the present invention relates to a method of manufacturing a solar energy collection system. The method includes providing a waveguide layer, providing a lens array in combination with the waveguide layer, and forming prism or mirrored facets on the waveguide layer by exposing the waveguide layer and at least one additional layer to light.

Additionally, in at least one embodiment, the present invention relates to a method of capturing solar energy. The method includes receiving light at a waveguide component, and reflecting at least a portion of the received light at a plurality of prism or mirrored facets formed along a surface of the waveguide component, where substantially all of the reflected light experiences total internal reflection within the waveguide component subsequent to being reflected by the prism or mirrored facets. The method also includes communicating the reflected light within the waveguide component toward an edge surface of the waveguide layer, and receiving the communicated reflected light at a photovoltaic cell upon the communicated reflected light being transmitted through the edge surface.

Further, in at least one embodiment, the present invention relates to a system for capturing solar energy. The system includes an optical waveguide layer, having an upper and lower cladding layer, and a lens array having a plurality of lenses, disposed above the upper cladding layer, and upon which sunlight is incident. The system also includes an array of injection features formed on the optical waveguide layer and arranged so that each injection feature is located at or near the focus of a respective one of the lenses, wherein each of the injection features is oriented so that light focused from the lens onto the respective injection feature is coupled into the optical waveguide layer. The system further includes at least one photovoltaic cell positioned along at least one edge surface of the optical waveguide, wherein the light coupled into the optical waveguide layer is guided by the waveguide toward and absorbed by the at least one photovoltaic cell.

In at least one further embodiment, the present invention relates to a solar photovoltaic system that includes a solar concentrator that collects direct sunlight into a small-area PV cell, overlapping in light collection area with a non-concentrated solar panel that collects indirect sunlight into a large-area PV or solar-thermal panel.

BRIEF DESCRIPTION OF THE DRAWINGS

FIGS. 24A-24D, 26A-C and 28B are further schematic perspective views of portions of additional exemplary embodiments of solar energy devices that are arranged to facilitate various manners of concentration of light; and FIGS. 25, 27 and 28A are additional schematic views illustrating manners of concentration employed by some of the solar energy devices shown in FIGS. 24A-24D, 26A-C and 28B as well as at least one other type of solar energy device.

DETAILED DESCRIPTION OF THE PREFERRED EMBODIMENT

Figure 1:
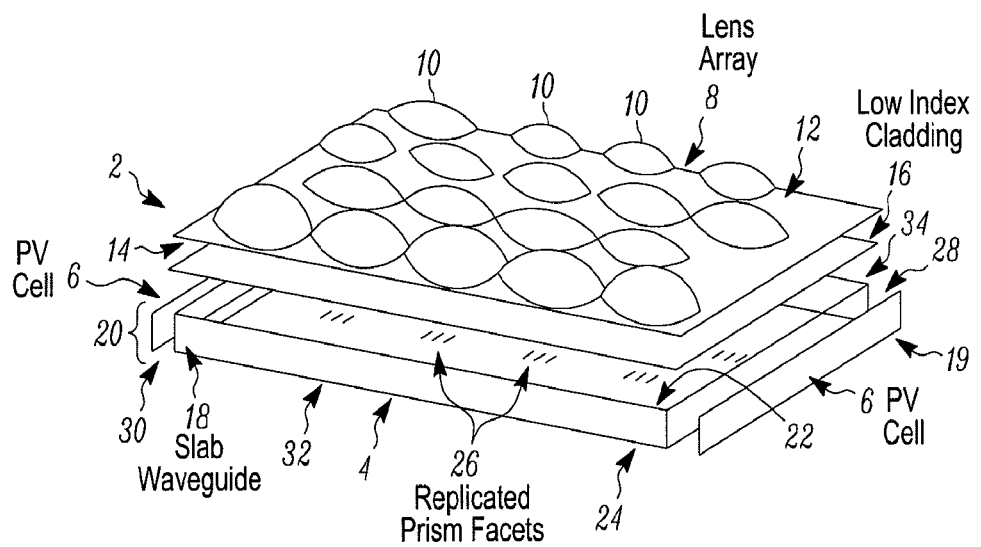
FIG. 1 is a schematic, perspective, exploded view of an additional exemplary solar energy device employing components allowing for concentration and collection of incoming light, in accordance with at least one embodiment of the present invention.

Referring to FIG. 1, an exploded view of a solar energy system 2 in accordance with one embodiment of the present invention is provided. As shown, the solar energy system 2 includes a solar concentration section 4 and multiple PV cells 6. The solar concentration section 4 can also be referred to as a micro-optic concentration section in view of the small size of the structure and its components relative to the overall physical structure of the system 2. More particularly as shown, the solar concentration section 4 includes a lens array 8 having multiple lenses 10 arranged substantially along a plane. The lenses 10, which in the present embodiment are formed by embossing the lenses on a surface of glass or plastic superstrate, can be referred to as microlenses, again in view of their size relative to the overall physical structure of the system 2. Sunlight (or possibly other incoming light) is incident upon an outer surface 12 of the lens array 8, and exits the lens array by way of an inner surface 14 on the opposite side of the lens array relative to the outer surface.

In addition, the solar concentration section 4 further includes additional waveguide portions 19 (aside from the lens array 8). The additional waveguide portions 19 include a low index cladding layer 16 and a slab waveguide 18. When the solar energy system 2 is assembled, the low index cladding layer 16 is positioned in between the lens array 8 and the slab waveguide 18. The low index cladding layer 16 can be, for example, a Teflon AF or related fluoropolymer material, while the slab waveguide 18 can be made from glass (e.g., F2 flint glass) or an acrylic polymer. The slab waveguide 18 has a thickness 20, an inner surface 22 that is in contact with the low index cladding layer 16 (when the section 4 is assembled) and an outer surface 24 opposite the inner surface and separated from the inner surface by the thickness 20. A plurality of prism facets 26 are formed along the outer surface 24. The respective prism facets 26 are aligned with the respective lenses 10 and the thickness 20 is determined so that a respective focal point of each of the lenses occurs at a respective one of the prism facets. As discussed below, in practice, the prism facets 26 are much smaller in extent relative to the lenses (for descriptive purposes, the prism facets are not drawn to scale in FIG. 1).

The prism facets 26 are intended to be representative of a variety of different types of injection facets or injection features that are configured to refract, reflect, diffract, scatter, and/or otherwise direct light incident thereon so that the light entirely or substantially remains within the slab waveguide 18 or at least is partly restricted from exiting the waveguide, any and all of which are encompassed by the present invention. While the prism facets 26 particularly can be considered as injection features that are largely or entirely refractive in their operation, other forms of injection features also encompassed by the present invention such as mirrored facets can be considered largely or entirely reflective, in some embodiments, the injection features employed will provide any one or more of refraction, reflection, diffraction (e.g., in the form of a diffraction grating) or scattering. As discussed further below, the prism facets 26 (or other light directing/injection features) can be formed using any of a variety of techniques that can involve, for example, embossing, molding, ruling, lithography, or photolithography. In some embodiments, the outer surface 24 of the waveguide 18 includes an additional cladding layer in addition to the prism facets 26.

The overall optical collection efficiency of the concentrator/solar energy system depends upon, among other things, the exact lateral and vertical position of the injection features (e.g., the positions of the injection features relative to lenses), as well as on the physical profile of the injection features (the shapes and orientations of one or more particular facet surfaces of the injection features). Among other things, the angle(s) of the injection features (e.g., the angles of surfaces of the injection features relative to the outer surface 24 of the waveguide 18 on which those injection features are mounted) can be of significance. Often these angles are determined in a manner that takes into account the angle(s) at which light is expected to impinge the injection features. For example, where light is expected to impact one of the prism facets 26 at smaller angles (e.g., 0 to 15 degrees relative to an axis normal to the outer surface 24 of the waveguide 18), the angle of the facet surface relative to the outer surface 24 can be 30 degrees, while where light is expected to impact one of the prism facets at larger angles, the angle of the facet surface relative to the outer surface 24 can be 45 degrees. It will be understood that, in developing any given solar concentrator, one can employ optical design software to generate injection feature profiles that are appropriate given the combination of material properties and physical and fabrication constraints (and expected operational constraints) that apply to that particular embodiment.

Further as shown, the inner and outer surfaces 22, 24 of the slab waveguide 18 are each rectangular, such that the slab waveguide 18 has first, second, third and fourth edge surfaces 28, 30, 32 and 34, respectively, extending between the inner and outer surfaces, where the first and second edge surfaces oppose one another and the third and fourth edge surfaces oppose one another. While fully-reflecting coatings can optionally be applied to the third and fourth edge surfaces 32, 34, the PV cells 6 are arranged along the first and second edge surfaces 28 and 30. As shown, each of the PV cells 6 more particularly in the present embodiment has a width equaling the thickness 20, and extends along the entire respective one of the oppositely-oriented edge surfaces 28, 30. The first and second edge surfaces 28, 30 at which the PV cells 6 are located can also be referred to as longitudinal edge surfaces since they are at opposite ends of the length of the slab waveguide 18 and are the edges toward which light is being directed by the waveguide.

Figure 2:
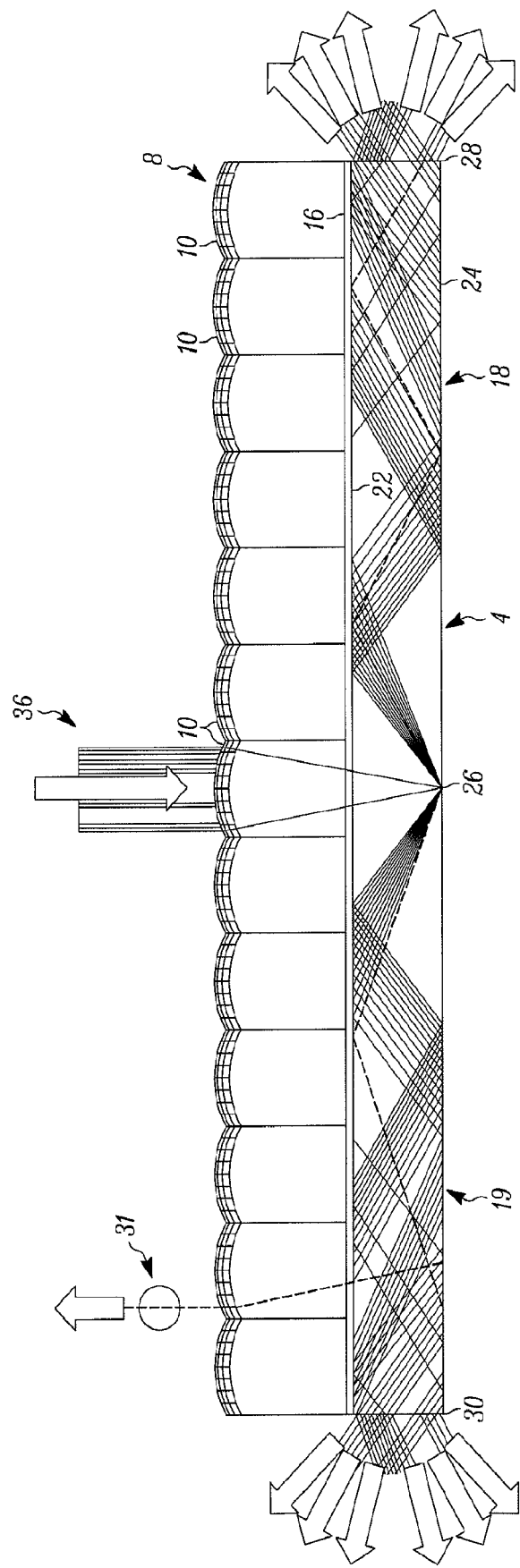
FIG. 2 is a schematic, cross-sectional elevation view of the solar energy device of FIG. 1 that particularly illustrates exemplary light paths that occur within that device.

Referring additionally to FIG. 2, a cross-sectional view of the solar concentration section 4 of the solar energy device 2 (that is, the solar energy device 2 with the PV cells 6 removed) in assembled (rather than exploded form) is provided, which particularly illustrates exemplary operation of the solar concentration section 4 in channeling light to the first and second edge surfaces 28, 30 along which the PV cells 6 are to be mounted. As shown, light rays (e.g., sunlight) 36 enter an exemplary one of the lenses 10 of the lens array 8 and, upon doing so, are focused by that lens. The focused light proceeds through the low index cladding layer 16 and subsequently into the slab waveguide 18, with the light then proceeding from the inner surface 22 of the slab waveguide to the outer surface 24 of the slab waveguide. Ultimately, the focused light reaches an exemplary one of the prism facets 26 located along the outer surface 24 of the slab waveguide, with the focal point of the focused light occurring at that prism facet.

Although the incident light rays 36 focused by the exemplary one of the lenses 10 and received by the exemplary one of the prism facets 26 is particularly shown in FIG. 2, it will be understood that other light rays (not shown) incident upon each of the other lenses 10 would similarly be focused by the respective lenses and proceed through the low index cladding layer 16 and through the slab waveguide 18 to other respective ones of the prism facets (not shown).

The prism facets 26 in particular are reflective facets that are configured to reflect (or "inject") the focused light back into the slab waveguide 18 at sharp angles such that when the light reencounters the low index cladding layer 16 it is again reflected into the slab waveguide. That is, once the prism facets 26 have acted upon the focused light, the light reflected off of the prism facets experiences total internal reflection (TIR) or at least substantially experiences TIR within the slab waveguide 18 as far as the light's interaction with the low index cladding layer 16, the outer surface 24 and the third and fourth edge surfaces 32, 34 (due to the reflective coating applied thereto) is concerned. To the extent that TIR is only substantially (but not exactly) achieved, a small portion of the light still escapes the slab waveguide 18 as a decoupling loss 31. Regardless, once light has entered the slab waveguide 18 by way of the low index cladding layer 16, all or substantially all of the light continues to reflect repeatedly within the waveguide until it reaches either of the first or second edge surfaces 28, 30. In the absence of the PV cells 6, light reaching the edge surfaces 28, 30 would escape from the slab waveguide 18 as illustrated in FIG. 2; however, in the presence of the PV cells 6, the light reaching the edge surfaces 28, 30 enters the PV cells and is converted into electricity.

The TIR experienced by light within the slab waveguide 18 is completely independent of wavelength and polarization over a wide range of angles that are steeper than the critical angle. The angle of incidence at the first and second edge surfaces 28, 30 is less than the critical angle, so the light can be emitted through those surfaces. In order to ensure that all (or substantially all) of the light trapped within the slab waveguide 18 is coupled into the PV cells 6, the PV cells typically have an anti-reflection coating (or an index-matching layer between the waveguide and the surface of the PV cell), it should be noted that the operation of the slab waveguide 18 is not perfectly efficient, since the prism facets 26 that reflect the light so that TIR occurs can also act to strip the light from the waveguide. However, in this regard, it is significant that the diameter of the focal spots occurring at the prism facets 26 is roughly one percent of the diameters of the lenses 10 (e.g., a 1 mm diameter lens can produce approximately a 10 micron spot), such that the total area of the focal spot is 0.01% of the area of the lens, and such that the surface of the waveguide is 99.99% reflective (thus light can propagate for hundreds of lens diameters before significant amounts of light are lost).

The shape and sizes of the prism facets 26 or other injection features such as mirrored facets employed in any given embodiment can vary depending upon the embodiment (indeed, different ones of the prism facets along the same waveguide can have different shapes/sizes). Often, the particular injection features employed will desirably be tailored specifically for the application. In at least one embodiment, the prism (or mirrored) facets 26 are symmetric, triangular in cross section, and couple light equally to the left and the right as illustrated in FIG. 2. Such a shape is easy to fabricate due to the lack of sharp transitions. In another embodiment, the prism (or mirrored) facets 26 can have sawtooth-shaped features that reflect light primarily or entirely toward one or the other of the PV cells 6 at the opposite edge surfaces 28, 30. In some other embodiments, more than two PV cells are employed along more than two of the edge surfaces, or only one PV cell is employed along only one of the edge surfaces. Further, while in some embodiments there is only a single PV cell along any given one of the edge surfaces, in other embodiments there are more than one PV cell along one or more of the edge surfaces.

As noted above, it is desirable that a solar energy system employing both solar concentrators and PV cells such as the solar energy system 2 be easily manufactured so as to reduce manufacturing costs. Further, with respect to the present solar energy system 2, accurate alignment of the respective prism facets 26 relative to the respective lenses 10 is an important consideration in obtaining effective performance of the solar energy system. While manual alignment of the prism facets 26 relative to the lenses 10 is possible, this becomes more difficult as the prism facets 26 become smaller, which (as discussed above) is desirable to minimize the amount of light that escapes from the slab waveguide 18. In view of these considerations, referring to FIG. 3, in at least some embodiments of the present invention, an automated manufacturing process 40 is employed to create the solar energy system 2. In particular, as will be discussed below, in at least some such embodiments, a "self-alignment" process is employed to form the prism facets 26. Also as will be noted, by employing the manufacturing process 40, it is particularly possible to manufacture solar energy systems 2 (especially the solar concentration sections of those systems) in sheets in a batch manner using rollers and other conventional mass-production technologies, that is, in a roll-processing manufacturing process.

Figure 3:
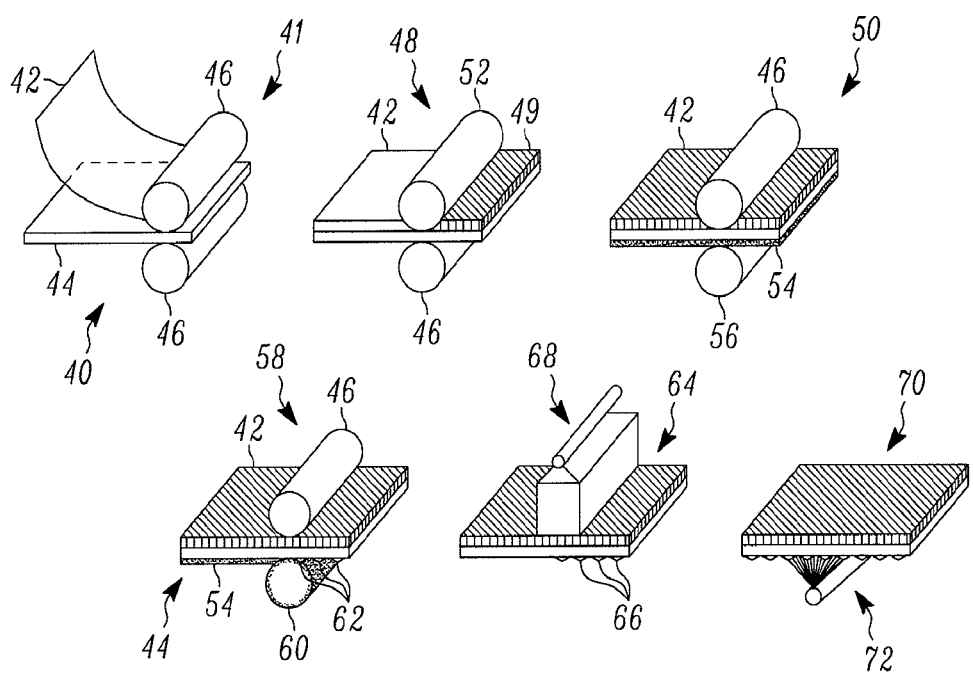
FIG. 3 is a schematic diagram illustrating exemplary steps of a manufacturing process that can be employed to produce a device such as that shown in FIGS. 1-2.

As shown in FIG. 3, the process 40 begins at a step 41 by applying a superstrate 42, composed of acrylic or similar material, upon an assembly 44 including a slab waveguide portion upon which a low index cladding layer has already been applied (such that the cladding layer is ultimately positioned between the superstrate and the slab waveguide portion). This can be performed by way of rollers 46 as shown. Next, at a step 48, lens array embossing is performed by way of an embossment roller 52 so as to form lenses 49 in the acrylic superstrate 42. Next, at a step 50, an ultraviolet-curable epoxy serving as a molding film/photoresist 54 is further applied by a molding film application roller 56 along the outer surface of the assembly 44 (that is, the surface which does not face the acrylic superstrate 42). Upon being applied, the molding film/photoresist 54 can be considered to be part of the slab waveguide portion of the assembly 44. Additionally, at a step 58, a ruled prism master roller 60 is employed to emboss/stamp intermediate prism facet formations 62 within the molding film/photoresist 54.

Next, at a step 64, localized prism facets 66 are particularly formed in the intermediate prism facet formations 62. The localized prism facets 66 are formed in particular by shining light from a light source (or multiple light sources) 68 through the lenses 49, where the light in particular serves to expose apertures in the molding film/photoresist 54. That is, the light causes certain portions of the molding film/photoresist 54 that are desired as the localized prism facets 66 to be cured. The light source 68 can be a deep blue 420 nm light, for example, since this is the longest wavelength that will crosslink the epoxy and minimize the effect of chromatic aberrations from the lenses. Subsequently at a step 70, a solvent bath 72 removes excess uncured facet material (e.g., removes unused, uncured material of the molding film/photoresist 54) such that only the localized prism facets remained (approximately 99.99 of the molding film/photoresist 54 is removed).

Subsequent to the step 70, additional steps (not shown) involve spraying the bottom surface of the waveguide (that is, the outer surface of the assembly 44 including the localized prism facets 66 with another thin layer of low-index cladding material, depositing a metal mirror on certain edge surface(s)

of the waveguide (e.g., the edge surface corresponding to the surfaces 32, 34 mentioned above), and then mounting the PV cells upon the overall assembly, particularly along the remaining (unmirrored) edge surface(s) of the slab waveguide (e.g., the edge surfaces corresponding to the surfaces 28, 30 mentioned above).

By using the above-described process (or similar processes) of manufacture, it is possible to create solar energy systems such as the solar energy system 2 of FIGS. 1-2 having a variety of dimensions and optical characteristics. For example, the concentration power of the lenses 10 can vary depending upon the embodiment and, in one exemplary embodiment, the concentration power of the lenses is 500 suns. Also, in one embodiment, the length of the slab waveguide 18 (that is, the distance along which light is intended to flow through the waveguide, e.g., the distance between the two PV cells 6 at the edges 28, 30) can be of any arbitrary length, for example, several meters long. Likewise, the width of the slab waveguide 18 (that is, the distance across the slab waveguide perpendicular to the distance along which light is intended to flow, and perpendicular to the thickness 20) can be arbitrarily large or small, for example, 500 millimeters or alternatively 1 meter. Also, the thickness 20 can be arbitrarily large or small. Typically, it is desired that the thickness 20 be small, and/or that the thickness at least in part be determined by the characteristics (e.g., the concentration powers/focal lengths) of the lenses 10. In one embodiment, further for example, the lenses 10 are F/2.9 lenses and the thickness is only 6 mm (which is far less than for thin parabolic reflector optics).

Figure 4A:
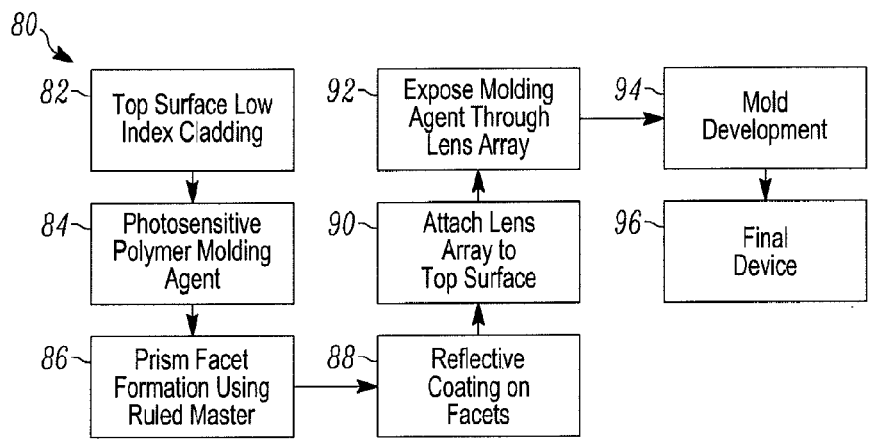
FIGS. 4A-4C are flow diagrams further illustrating other exemplary manufacturing processes that can be employed in producing a device such as that shown in FIGS. 1-2.

A variety of other operational processes are also intended to be encompassed within the present invention in addition to that described above with respect to FIG. 3. For example, with respect to FIG. 4A, a modified version of the process 40, shown as a process 80, includes a slightly-different set of operational steps than those shown in FIG. 3. More particularly as shown, the process 80 begins at a step 82 with the addition of low index cladding to one (e.g., the top) surface of a slab waveguide, continues at a step 84 with the addition of a photosensitive polymer molding agent to an additional, opposed (e.g., the bottom) surface of the slab waveguide, and further continues at a step 86 with the formation of prism facets in the molding agent using a ruled master. Next, at a step 88, a reflective coating is placed onto the prism facets, at a step 90 a lens array is attached to the low index cladding (e.g., attached to the top surface of the slab waveguide as modified to include the cladding), and at a step 92 the molding agent is exposed to light via the lens array. Finally, at a step 94 mold development occurs, followed by remaining actions (e.g., attachment of the PV cells) that result in a final device at a step 96.

Figure 4B:
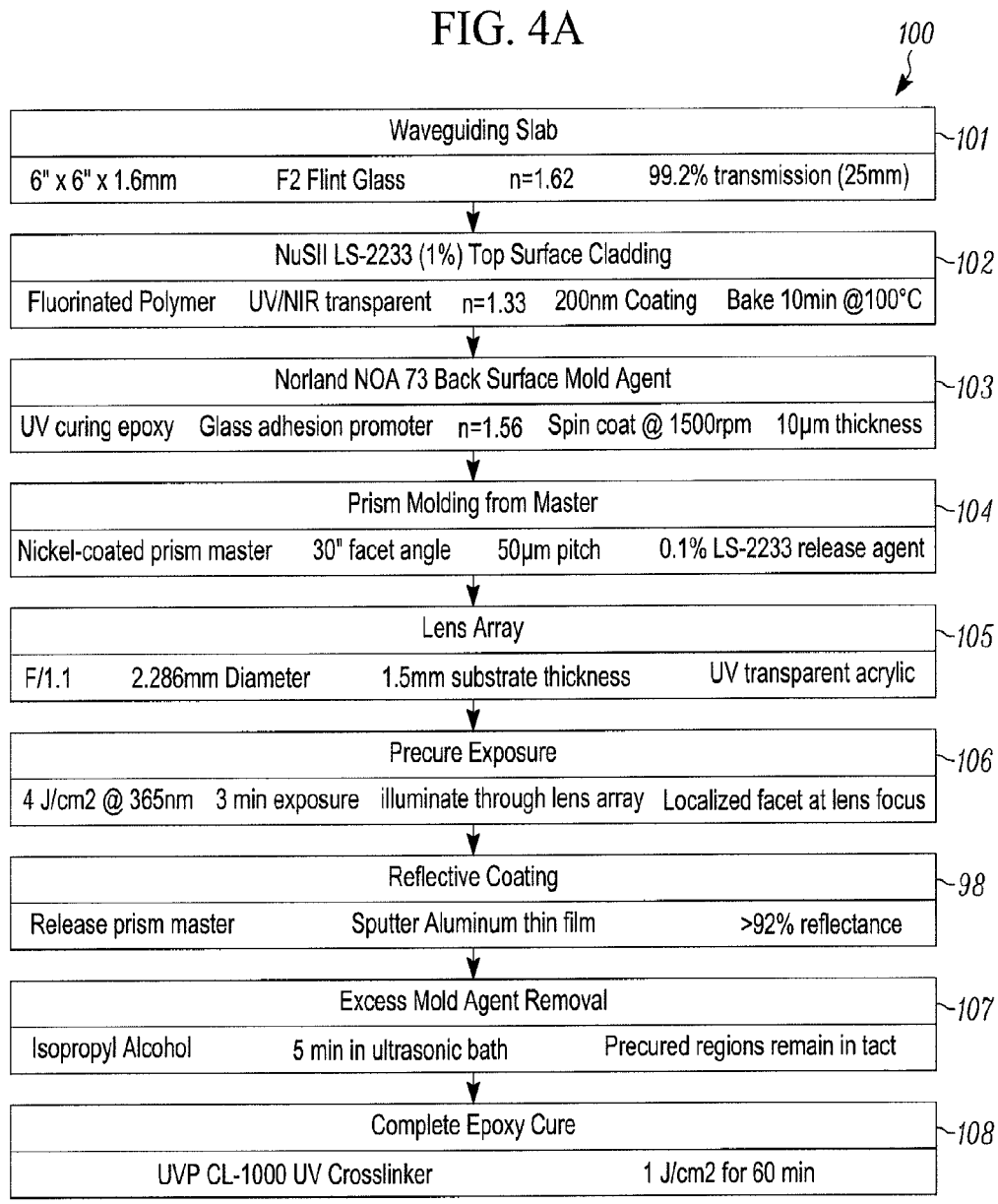

Further for example, FIG. 4B shows an additionally modified version of the process 80, shown as a process 100. As shown, the process 100 includes steps 102-108 that respectively correspond to the steps 82-96 of the process 80 respectively (except insofar as no step corresponding to the step 88 is included). Additionally, a step 101 shown to precede the step 102 merely is indicative of the fact that a slab waveguide is provided prior to the application of the low index cladding layer in the step 102, and a step 98 is shown to be performed between the steps 106 and 107, in which a reflective coating is applied to the slab waveguide (e.g., along edge surfaces such as the edge surfaces 32, 34 of FIG. 1). (The step 98 can be considered a substitute for the step 88 of FIG. 4A).

Figure 4C:
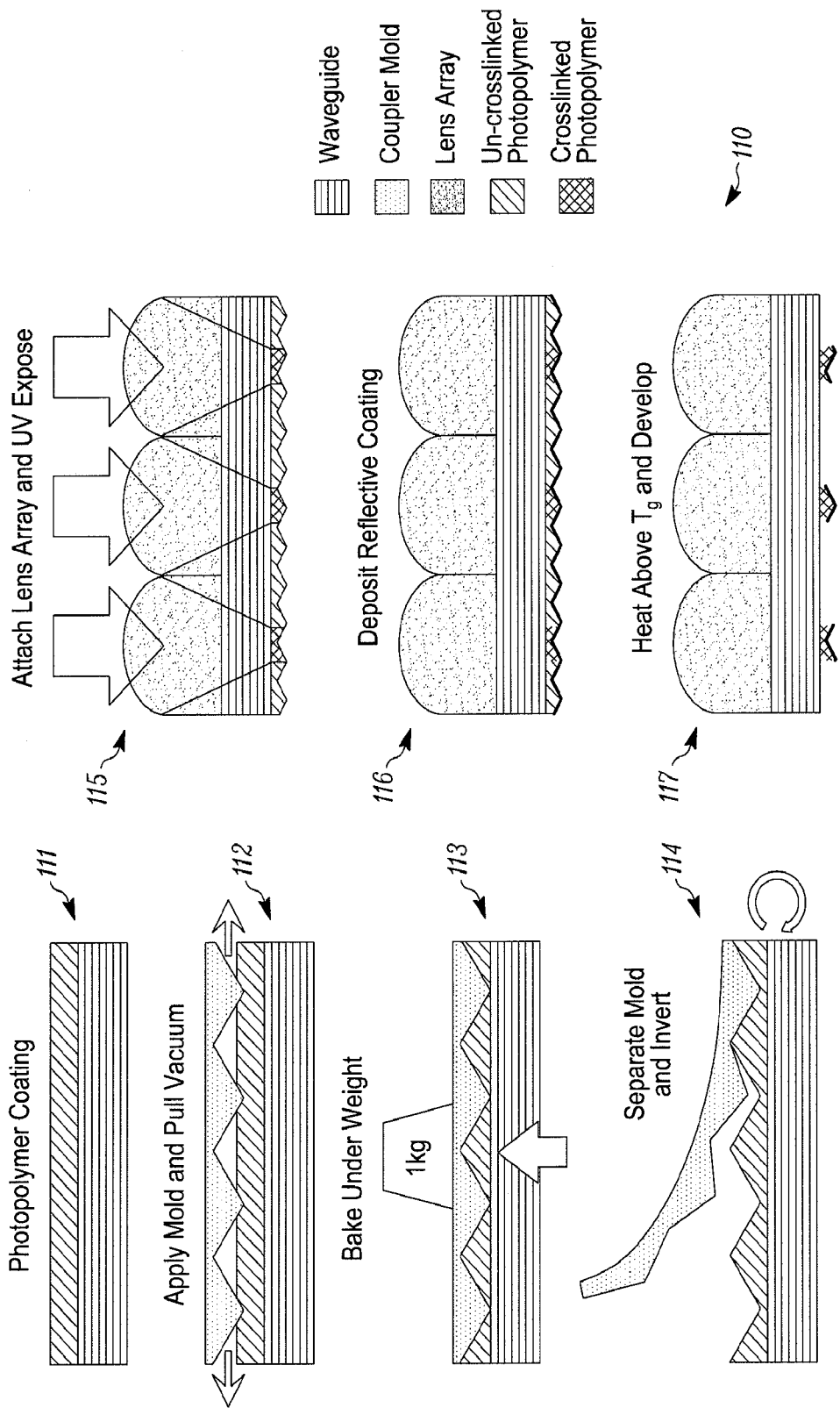

Additionally for example, FIG. 4C shows in yet another form a process 110 for manufacturing a solar energy system such as the system 2 of FIGS. 1-2. As shown, the process 110 begins at a step 111 by applying an un-crosslinked photopolymer coating onto a waveguide. Next, at a step 111, a mold is applied to the photopolymer coating and additionally a pull vacuum is applied. Subsequently, at a step 112, the waveguide, photopolymer coating and mold are baked with weight (pressure) applied, particularly pressure upon the mold tending to compress the assembly as shown. Further, at a step 113, the mold is removed. The removal of the mold leaves the molded photopolymer coating exposed. The waveguide and molded photopolymer coating is at this time then inverted.

Next, at a step 114, a lens array is attached to the waveguide along its side that is opposite the side on which the photopolymer coating is attached. As illustrated particularly in FIG. 4C, ultraviolet light is further directed so as to be incident upon the lens array. The ultraviolet light in turn passes through the lens array and the waveguide and then reaches the molded photopolymer coating. Due to the focusing of the lenses of the lens array, the ultraviolet in particular only reaches (is focused upon) specific portions of the molded photopolymer coating, and these specific portions of the coating in turn become crosslinked photopolymer. Next, at a step 115, a reflective coating is deposited upon the exposed outer surface (that is, the surface not in contact with the waveguide) of the molded photopolymer coating, including the un-crosslinked and crosslinked portions. Finally, at a step 116, the overall assembly is heated above a glass transition temperature (Tg), the un-crosslinked portions of the photopolymer coating are removed (so as to complete formation of prism facets) and a completed solar concentration section, suitable for implementation in a solar energy system such as the system 2, results.

Figure 5:
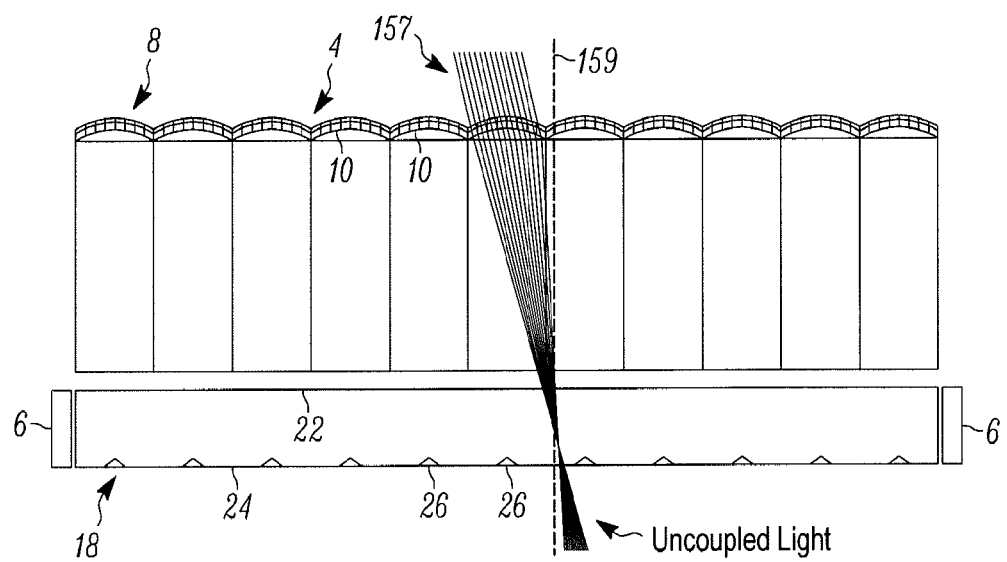
FIG. 5 is an additional schematic, cross-sectional elevation view of the solar energy device of FIG. 1 illustrating possible exemplary operation when incident light impinging the solar energy device is tilted relative to an axis normal to the solar energy device.

The solar concentrators within the above-described solar energy systems including the solar concentrator section 4 of the solar energy system 2 can be referred to as passive solar concentrators. In such solar concentrators, the refractive/reflective properties of the lenses and prism facets 10 are fixed such that variation in the angle of incidence of incoming sunlight (or other light) as a function of movement of the sun (or otherwise) alters the degree of concentration and efficiency of the device. Referring to FIG. 5 in this regard, for example, a cross-sectional view of the solar energy system 2 of FIG. 1 is provided with respect to which incident light 157 is shown to be tilted relative to a normal axis 159 (which is perpendicular to the surfaces 22, 24 of the slab waveguide 18). As shown, if the incident light 157 is tilted in this manner, the light after passing through a given one of the lenses 10 of the lens array 8 is no longer directed toward the respective one of the prism facets 26, but rather misses the prism facets. Assuming that the outer surface 24 is transparent generally, that light can pass completely out of the slab waveguide 18 such that it is no longer directed to the PV cells 6 but rather simply is uncoupled light.

To reduce or minimize the amount of incident light that is lost due to the light being imperfectly aligned with the solar energy system 2 as illustrated by FIG. 5, in at least some embodiments the solar energy is modified, takes other forms, or can be operated in particular manners than as discussed above. In at least some embodiments, for example, to allow for enhanced performance of such a solar energy system notwithstanding variation in the angle of incidence of incoming light, the system in at least some embodiments is mounted upon (or otherwise implemented in conjunction with) an active alignment system.

Further, as noted above, in at least some additional embodiments, the prism facets 26 are configured to be more tolerant of variations in the incidence angles of light impinging the solar energy system. Indeed, in at least some such embodiments, the upward-facing lenses 10 can themselves be used during the construction of the system 2 to identify and form the location of the coupling prism facets 26, for example, as shown in the step 68 of FIG. 3. That is, while in some embodiments, the prism facets 26 that are formed in the manner described with respect to FIG. 3 are localized discrete facets intended to receive incoming light along a particular path, it is possible in other embodiments for the angle and intensity properties of the light used during the exposure to be altered so as to form prism facets that are arcs or other structures instead of merely localized discrete facets. When appropriately configured, such arcs or other structures can direct light into the waveguide 18 even though the incoming path of the light varies with the path taken by the sun over the course of a day. Thus, through a customized facet exposure/formation process to form such arcs and other structures, and the subsequent use of such arcs or other structures, which can be said to "mimic" the path of the sun, the daily collection efficiency of the system 2 can be enhanced even when only using relaxed or no active solar tracking.

Further, in other embodiments of the present invention, it is envisioned that certain physical characteristics of the solar concentrators, and particularly the prism facets/injection features or coupling medium, will actively respond to variations in the angle of incidence of incoming sunlight (or other light) and thus performance of the solar concentrators will be enhanced, in the absence of for in addition to) any active alignment system. The solar concentrators of such embodiments, which can be referred to as reactive concentrators, operate by providing a large area region that can temporarily form (or reveal) prism facets/injection structures using a material that reacts to bright light at or near the focus of a lens. This creates a local change in the optical properties, which covers only a small fraction of the total area within the total guiding structure. As the sun's illumination angle changes, the positions of these prism facets/injection features/defects passively react and move along with it. Thus, such reactive concentrators do not require active alignment or tracking to capture and convert specular sunlight into electricity.

Various embodiments of solar energy systems with reactive solar concentrators are possible. As noted, in some embodiments, the sun's heat and/or illumination is used to form the locations of the prism facets. This can be in the form of thermal expansion or other mechanical motion to bring the prisms in close contact with the guiding layer, in other embodiments, the prism facets are positioned just along the outer surface of the slab waveguide, just outside of that surface (that is, outside of the waveguide). An intermediate medium that responds to the location/intensity of the sun causes a localized physical change in the refractive index at the point of focus allowing light that is reflected off the prisms to be coupled into the high-index guiding slab waveguide. A localized high refractive index surrounded by a low-index cladding is desirable (or necessary) for the purpose of allowing the prism to encounter incoming light once and not adversely strip already guided light.

Depending upon the embodiment, several potential phenomena are available to generate the necessary localized index change. In at least some embodiments, a colloidal suspension of high index nanoparticles in a lower index fluid similar in optical properties to the outer cladding is provided. The particles can be smaller in size than the wavelength of light, and therefore seen as average and not individual scattering particles. An accumulation of high index particles causes the perceived index of refraction to rise creating the coupling window between the reflective prism facets and the guiding slab while still maintaining the lower-index cladding surround. One method for initiating this perceived index increase is using optical trapping forces inherent to high illumination flux. Other embodiments can incorporate photoconductive or weakly photovoltaic polymers which generate an electric field in the presence of intense illumination. The resulting field can exert forces on the high index particles causing them to migrate towards the areas of maximum flux, generally occurring at the point focus of each lens in the array. The system is still reactive in that the polymer can be placed everywhere behind the guiding slab and not require individually patterned electrodes. Other optically induced physical changes may aid in the coupling of light such as photochromic, photothermal or phase change materials.

Figure 6:
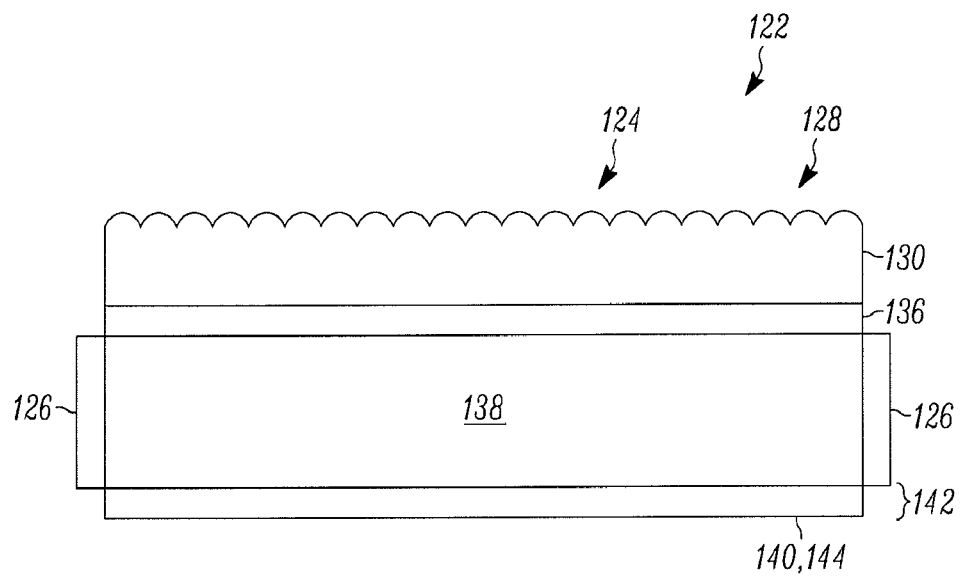
FIG. 6 is a schematic, cross-sectional elevation view of a further exemplary solar energy device differing from that of FIGS. 1-2, particularly in that it employs materials that react to sunlight to anciently couple light which is incident from a range of angles into a waveguide layer, in accordance with another embodiment of the present invention.

Referring to FIG. 6, a side elevation view of one exemplary embodiment of a solar energy system 122 employing a reactive concentrator section 124 in addition to PV cells 126 is shown. As shown, the reactive concentrator section 124 in particular is formed from several layers stacked together. On the top is an array 128 of lenses 130 used to form focal points from the incident sunlight. A low index cladding layer 136 exists just below the lenses 130 followed by a high index guiding layer (e.g., a slab waveguide layer or core) 138. Lastly a mirror (reflective) microstructure 140 sits below the high index guiding layer 138 with a gap 142 filled by a colloid in suspension (colloidal suspension) 144. The colloid 144 contains a low index fluid or gel with high index particles evenly dispersed within, achieving an average index similar to the cladding layer 136 found above the guiding layer 138. The PV cells 126 are placed at edge surfaces of the high index guiding layer 138 as with the solar energy system 2 of FIGS. 1-2 (also, while not shown, reflective coatings are placed on the other edge surfaces).

Figure 7:
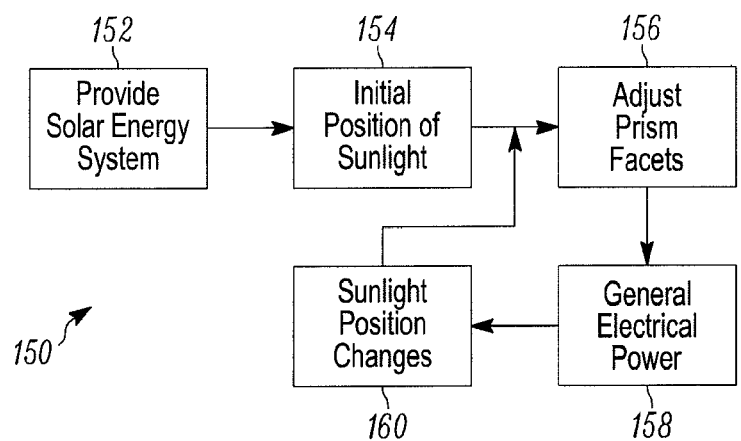
FIG. 7 is a flow chart illustrating exemplary steps of operation of the solar energy device of FIG. 6, particularly in terms of its reaction to positional variation of sunlight.

Turning to FIG. 7, the solar energy system 122 can be understood as operating generally according to a process 150. Upon providing of the solar energy system 122 at a step 152, sunlight is incident upon the solar concentrator section 124 at a step 154. Upon illumination, the lenses 130 focus the light so that it passes through all of the layers of the solar concentrator section 124 (e.g., the layers 136 and 138) so as to be incident on the mirror microstructure 140 as spots. Next, at a step 156, with high illumination flux, significant optical trapping forces are exerted on the particles suspended in the colloid 144. Particles outside the illumination cone undergo Brownian motion causing them to constantly migrate. Over time, more particles can be trapped by the illumination causing a local grouping of high index particles. Since each is significantly smaller than the wavelength of light, the sunlight only sees the average index of refraction which is increased by the accumulation of particles. Thus, a high index channel is created for light to couple into the guiding layer, and prism facets are created within the colloid 144. As discussed in relation to the solar energy system 2 of FIGS. 1-2, the coupling windows should remain small to reduce the probability of a ray which is already guided from seeing the microstructure beneath and scattering out of the core (this will ultimately limit the distance light can be guided and can be a main consideration of design).

Upon completion of the step 156, the angled prism facets of the mirror or grating reflect light at angles necessary to achieve TIR, such that the light reflected by the prism facets couple directly into the layer 138 (rather than refracting into and out of the various layers), and eventually then are channeled toward the PV cells 126, at which electrical power is then generated, as indicated by a step 158. Further, since the colloidal accumulation is optically induced and occurs locally, the system is able to react to the position of the sun.

That is, as indicated by a step 160, over time the angle of incidence of the sunlight upon the lenses 130 changes. When this occurs, the colloid 144 further responds so as to result in modified prism facets at the step 156. Thus, continued movement of the sunlight results in repeated performance of the steps 156, 158 and 160 (on a continuous basis).

In at least some embodiments, the colloid 144 can involve the suspension of titanium dioxide ($TiO_2$) particles. These are subwavelength particles with a very high index of refraction and have potential to be easily trapped and manipulated with sunlight. The particles will likely be coated with silica, etc., to avoid clumping due to Vander Waals forces. In at least one such embodiment, the colloid 144 includes both the titanium dioxide particles, which are nanoscale, high dielectric index particles, and also dense but low index of refraction fluoropolymer material, within which the particles are contained. During operation, the photosensitive material repeatedly senses and responds to changes in electric fields of portions of the light, by drawing in some of the high dielectric index particles (that is, due to the light exposure, some of the particles move from one location to another within the overall colloid) so as to achieve optical trapping. In other embodiments, other materials can be used as the colloid. Also, the colloidal solution is only one of many potential methods for creating a high index window to couple to the waveguide/core. Other static and mechanical possibilities exist as well as active electrical addressing. Phenomena including dielectrophoresis can also be utilized to manipulate the location of particles. It will be further understood that the solar energy system 122 of FIG. 6 employing the reactive solar concentrator 124 can be manufactured using processes similar to (albeit not identical to) the processes described above with respect to FIGS. 3-4B.

Figure 8:
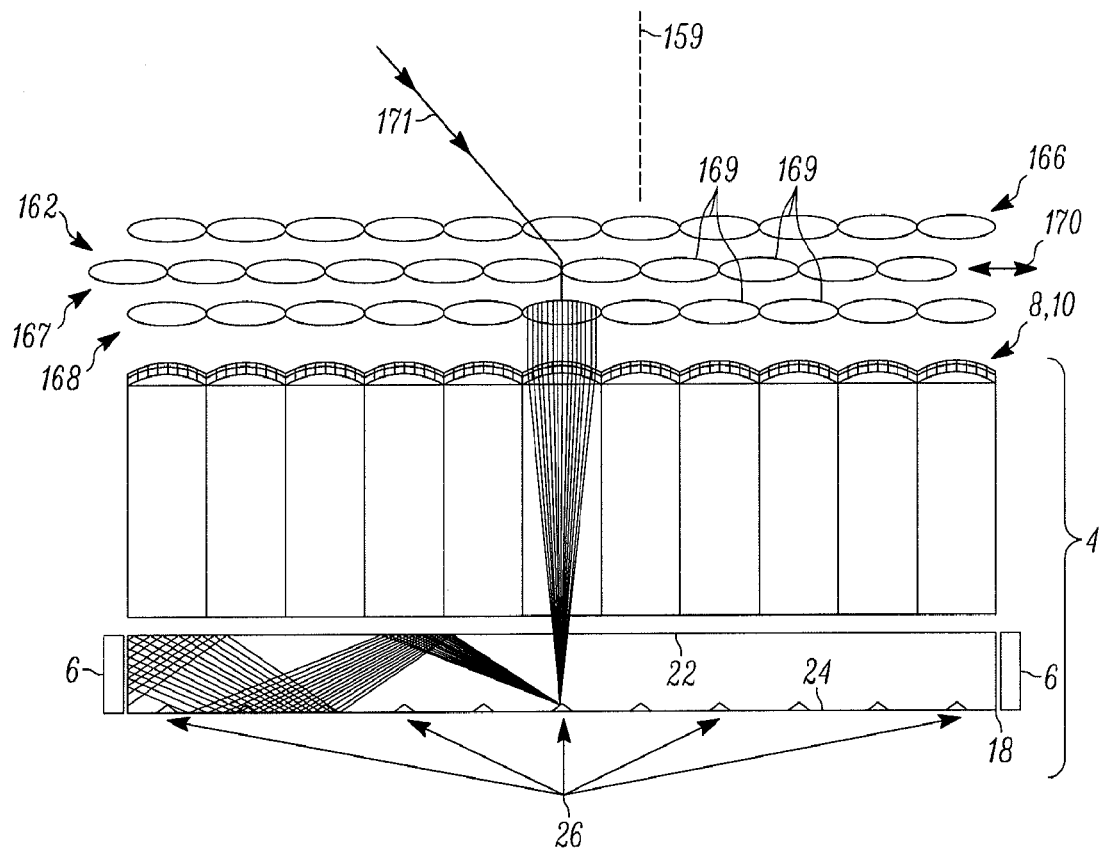
FIGS. 8-14 are additional schematic, cross-sectional elevation views of additional exemplary embodiments of solar energy devices that employ various forms of micro-tracking.

Notwithstanding the above discussion, in still additional embodiments of the present invention various techniques can be employed by which the solar energy system, rather than using full active tracking, instead employs micro-tracking features in which one or more components of the solar energy system are moved slightly relative to other components so as to achieve improved performance by the solar energy system in terms of its ability to receive and couple light to the PV cells 6 even when that light is incident in a tilted manner and/or varies in its angle of incidence over time. These slight movements can involve, for example, both lateral movements (that is, movements of the waveguide side-to-side but not toward or away from a lens array), as well as vertical movements (that is, movements of the waveguide toward or away from a lens array). Turning to FIG. 8 in particular, in one such embodiment a solar energy system 162 includes not only one or more PV cells 6 and the solar concentration section 4 with the slab waveguide 18 and the lens array 8 with the lenses 10 (as well as the prism facets 26) of the solar energy system 2 discussed above, but also includes first, second and third additional lens arrays 166, 167 and 168.

As shown, each of the lens arrays 166-168 includes a plurality of individual lenses 169. More particularly, the lenses of the first, second and third lens arrays 166, 167 and 168 are respectively arranged along first, second and third planes parallel to the plane along which the lens array 8 is arranged, with the third, second and first planes being positioned successively outwardly away from the lens array 8. In the present embodiment, each of the lenses 169 of each of the lens arrays 166-168 is identical. However, in other embodiments the lenses of the different lens arrays 166-168 can be different from one another and, indeed, in at least some embodiments different lenses of a given one of the lens arrays 166, 167 and/or 168 can also differ from one another. In the present embodiment, the lenses 169 of the different lens arrays 166-168 can be considered micro-lens arrays since the lenses are typically small in diameter (and equal in diameter to the lenses 10 of the lens array 8).

The lenses 169 of the lens arrays 166-168 are intended to be moveable relative to one another and/or the lenses 10 of the lens array 8 such that incident light that is incident upon the solar energy system 162 (and particularly incident upon the lenses of the lens array 166) at a variety of angles can still be ultimately directed in a manner so that the light is normally incident upon the lenses 10 of the lens array 8, that is, parallel or substantially parallel to the normal axis 159. In the present embodiment, the lens array 167 in particular is moveable along an axis of movement represented by an arrow 170 that is parallel to the inner and outer surfaces 22, 24 of the slab waveguide 18 and thus perpendicular to the normal axis 159. By appropriately adjusting the second lens array 167 relative to the other lens arrays 166, 168 (and 8), incident light 171 that is tilted relative to the normal axis 159 thus can be redirected so as to be normal upon the lens array 8 in a manner that is parallel or substantially parallel to the normal axis 159. Thus, even though the incident light 171 is tilted, light is effectively received and coupled by the solar concentration section 4 as if it were normally received and thus the solar concentration section is able achieve effective coupling of the light to the PV cells 6.

The embodiment shown in FIG. 8 employs a triplet of micro-lens arrays where the second lens array 167 in particular serves as a field lens that increases the fill factor at the output of the lens arrays (that is, the light as it proceeds toward the lens array 8). Nevertheless, in other embodiments other lens arrangements can also be employed. For example, in one other embodiment, only two lens arrays are employed (albeit such an embodiment can suffer from somewhat limited steering range and increased number of surface reflections, with the limited steering range being partly the result of the arising of spurious rays). In other embodiments, more than two lens arrays are present. Also, depending upon the embodiment, not merely the second lens array 167 but also (or instead) one or another of the lens arrays 166, 168 (and/or 8) can be moved. By appropriately moving such one or more lens arrays over time, changes in the direction of incident light as can be associated with movement of the sun over the course of a day (or as may occur for other reasons as well) can be largely compensated for, and thus, operation of the solar energy system 162 can continue unimpeded or largely unimpeded throughout the day.

Figure 9:
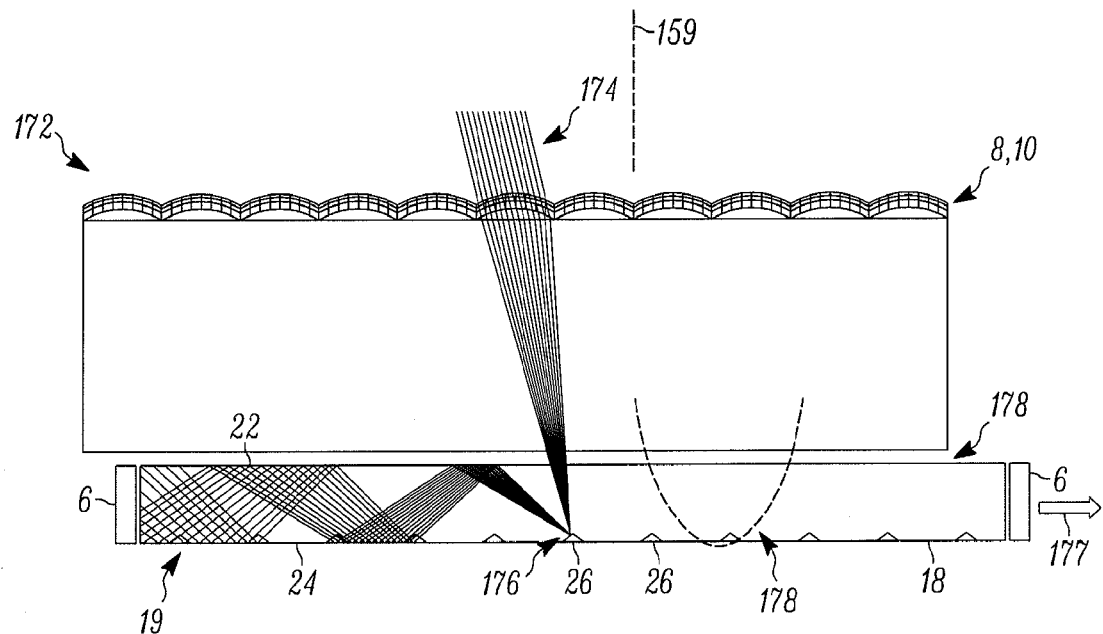

Turning next to FIG. 9, an additional embodiment of a solar energy system 172 also employs a micro-tracking capability that differs from that of FIG. 8. In the embodiment of FIG. 9, the solar energy system 172 can be understood to include the both the lens array 8 as well as the additional waveguide portions 19 of the solar concentration section 4 of the solar energy system 2 of FIG. 1 (e.g., the waveguide 18 with the prism facets 26, as well as possibly the cladding layer 16). However, in contrast to the solar concentration section 4, in this embodiment the lens array 8 is moveable relative to the additional waveguide portions 19 of the solar concentration section, such that the additional waveguide portions can be moved relative to the lens array 8 back and forth along a direction indicated by an arrow 177, the direction represented by the arrow 177 being parallel to the outer and inner surfaces 22 and 24 of the waveguide 16. In at least some such embodiments, a space 178 between the lens array 8 and the additional waveguide portions 19 can exist to facilitate such movement (such space can be filled with air or other cladding). By appropriately moving the additional waveguide portions 19

(this movement can involve a sliding movement along a bottom surface of the lens array 8) the additional waveguide portions can be positioned relative to the lenses 10 such that incident light 174 that is incident upon the lenses in a tilted manner relative to the normal axis 159 still is focused upon appropriate ones (in this example, an appropriate one) of the prism facets 26. Thus, even thought the incident light 174 is tilted, the light ultimate experiences TIR within the waveguide 18 and is directed to the PV cells 6.

As discussed with respect to FIG. 8, it will be understood that the appropriate positioning of the additional waveguide portions 19 relative to the lens array 8 will vary depending upon the particular angle of incidence of the incident light 174 relative to the normal axis 159 and thus, as that angle of incidence changes (e.g., again due to movement of the sun during the course of the day or for some other reason) the relative positioning of the additional waveguide portions relative to the lens array 8 will need to be appropriately modified so that the incident light continues to be directed towards one or more of the prism facets 26. Such appropriate positioning can be governed by a controller such as a microprocessor (not shown) that receives signals from one or more light sensors (also not shown) that detect the angle(s) of incidence of the incident light 174 (or at least predominant or substantial component(s) of that light) and based upon such received signals in turn adjusts the relative positioning of the additional waveguide portions 19 vis-à-vis the lens array 8. In general, the amount of shifting of the additional waveguide portions 19 relative to the lens array 8 will correspond to the degree of tilt in the incident light; increased tilt will typically require increased amount of shifting. Although the amount of shifting required to achieve a desired effect will vary depending upon the embodiment, the amount of shifting will often be quite small (e.g., on the order of 1 millimeter or less).

Figure 10:
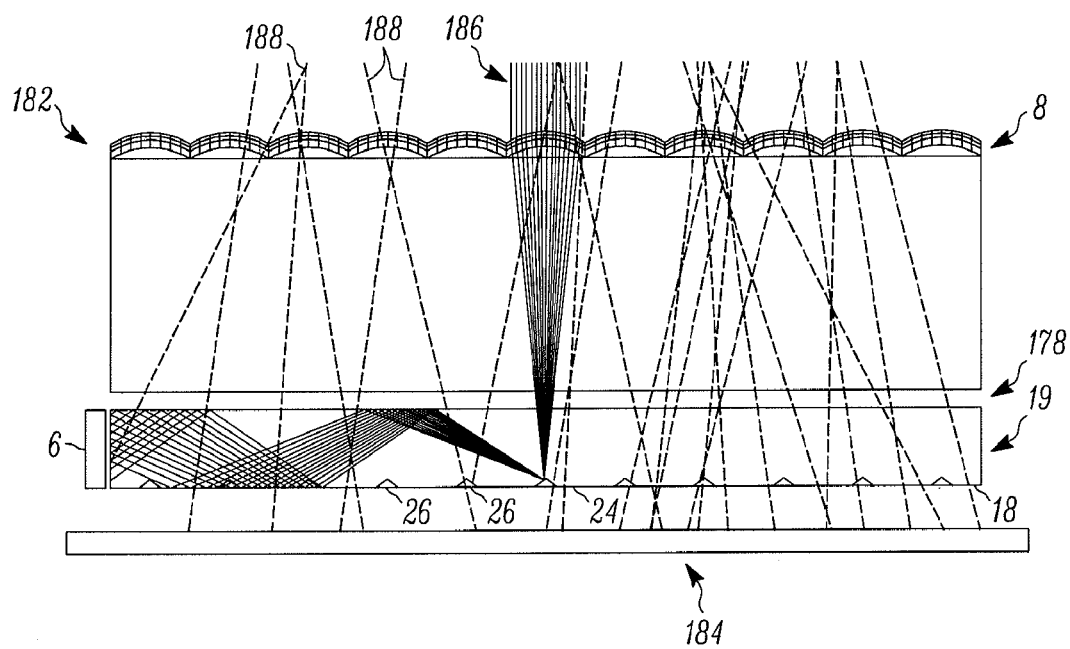

Turning to FIG. 10, in yet another embodiment of a solar energy device 182, not only is there present the lens array 8 as well as the additional waveguide portions 19 (and possibly the space 178 separating the two), but also there is an additional diffuse light collector 184 (which for example can be a large area PV cell panel or solar-thermal panel) that is positioned outside of the additional waveguide portions alongside the outer surface 24. Given such an arrangement, incident light 186 that is well-collimated is directed towards the prism facets 26 (particularly assuming that the additional waveguide portions 19 are appropriately aligned relative to the lens array 8), while other diffused light 188 that is incident upon the lens array 8 is not directed towards the prism facets 26 but instead is allowed to pass through the slab waveguide 18 completely and so is received at the diffuse light collector 184. Thus, well-collimated incident light is provided to the PV cells 6 while diffuse light is received at the diffuse light collector 184. Notwithstanding the effectiveness of the solar energy systems 162, 172, 182 discussed above with respect to FIGS. 8-10, the effectiveness of such solar energy systems can still be somewhat limited depending upon field curvature 178 as illustrated in FIG. 9.

Figure 11:
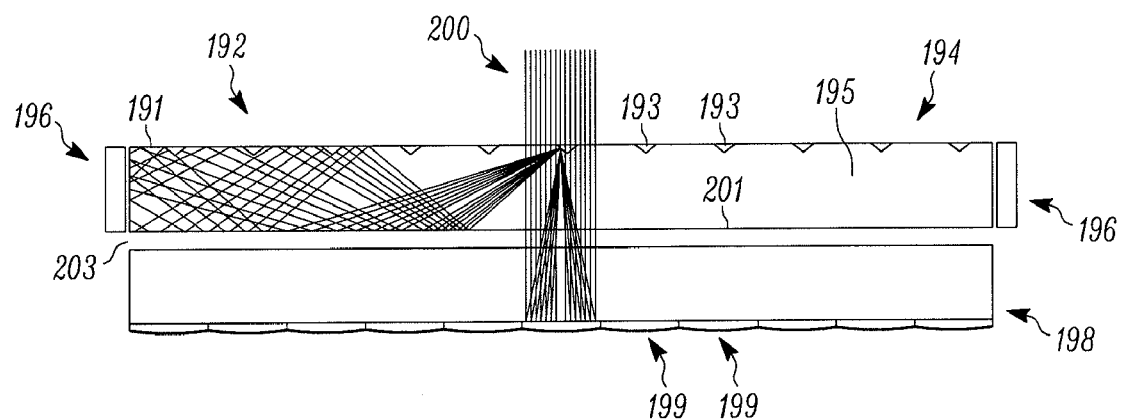
Figure 12:
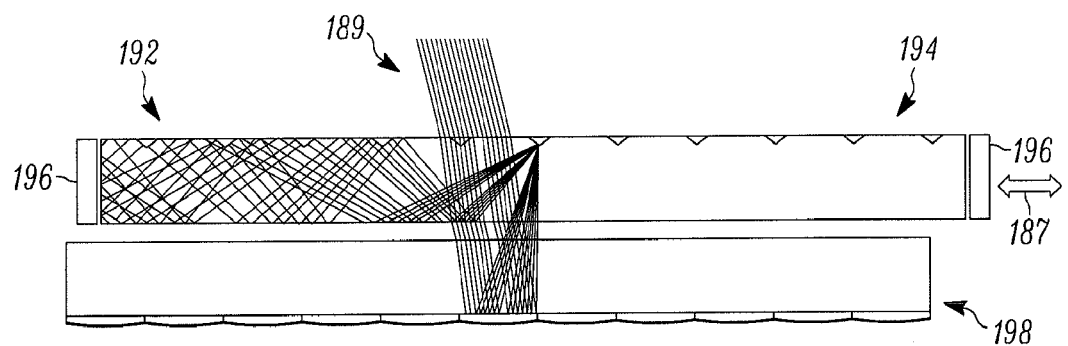

Next, referring to FIGS. 11-12, a further exemplary solar energy system 192 is shown in two different operational positions. As shown, the solar energy system 192 includes waveguide portions 194 that are similar to the additional waveguide portions 19 discussed above, and that particularly include a slab waveguide 195 and prism facets 193 by which light is directed to PV cells 196 at opposite ends of the slab waveguide. Additionally, the solar energy system 192 further includes a lens array 198 having a plurality of lenses 199. Further, as in the solar energy system 172, the waveguide portions 194 (and PV cells 196 mounted in relation thereto) are laterally shiftable relative to the lens array 198. However, in contrast with the solar energy system 172, the solar energy system 192 is configured to receive incident light that first impinges the system at an outer surface 191 of the waveguide portions 194 along which the prism facets 193 are located rather than at the lenses 199 of the lens array 198. More particularly as shown, incident light 200 passes through the outer surface 191, proceeds through the slab waveguide 195 and through an inner surface 201 of the slab waveguide (again at which can be provided a cladding layer), then through an air gap (or other possible cladding) 203 between the waveguide portions 194 and the lens array 198, and then through the lens array to the lenses 199. Upon reaching the lenses 199, the light is then reflected by the lenses back generally in the opposite direction toward appropriate ones of (in this case, one of) the prism facets 193, at which point the light experiences TIR and is directed to the PV cells 196. It will be understood that, to achieve operation in the above-described manner, the outer surface. 191 of the slab waveguide 195 is substantially transparent, while the lenses 199 are mirrors (or are lenses with a mirror coating applied thereto). The lenses 199 in the present embodiment can be more appropriately termed micro-mirrors given their small size.

While FIG. 11 shows the light 200 incident upon the waveguide portions 194 to be normal to waveguide portions (that is, perpendicular to the outer and inner surfaces 191, 201), the solar energy system 192 again allows for incident light that is tilted to also be captured and directed towards the PV cells 196. In particularly referring to FIG. 12, tilted incident light 189 also can be successfully directed to the PV cells 196 by laterally shifting the waveguide portions 194 relative to the lens array 198 by an appropriate amount along a direction (back and forth along the direction) represented by an arrow 187. It should further be noted that the use of the solar energy system 192 is particularly advantageous insofar as, due to the flatness (and typically robustness) of the outer surface 191, the solar enemy system realizes improved durability of packaging and ease of cleaning.

Figure 13:
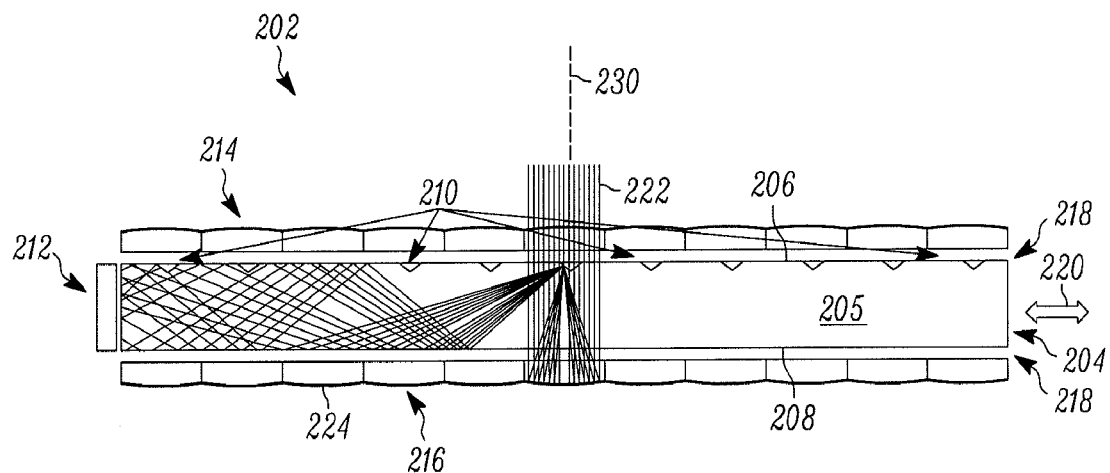
Figure 14:
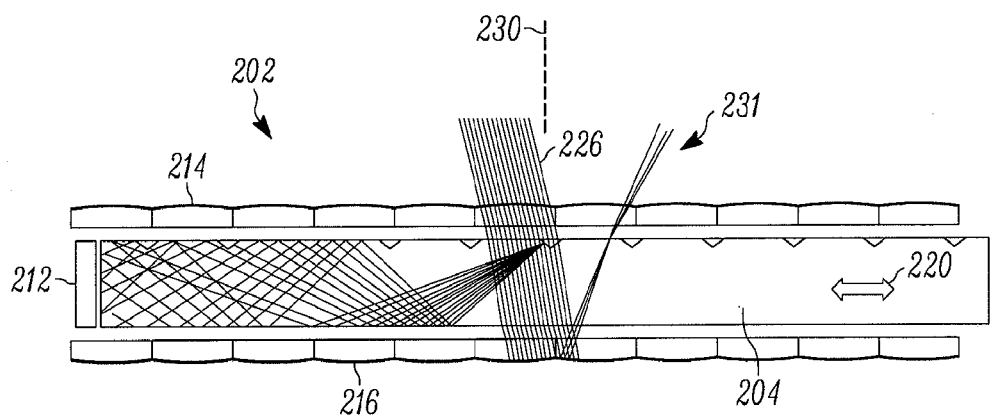

Turning to FIGS. 13 and 14, a further solar energy system 202 is shown in accordance with another exemplary embodiment of the present invention in which slight movements of system components allow for tilted incident light to be captured at the PV cells of the device. The solar energy system 202, for reasons that will be understood in view of the discussion below, can be particularly termed a micro-catadioptric concentrator system. Referring particularly to FIG. 13, the solar energy system 202 among other things includes waveguide portions 204 including a slab waveguide 205 having first and second surfaces 206 and 208 that are opposed to one another on opposite sides of the waveguide, and further having prism facets 210 that are positioned along the surface 206. PV cells (one of which is shown) 212 are positioned at one (as shown) or more edge surfaces of the waveguide 205. Additionally, the system 202 also includes a lenslet array 214 that is positioned along (and spaced apart from) the first surface 206 of the waveguide 205 and a micro-mirror array 216 that is positioned along (and spaced apart from) the second surface 208 of the waveguide. In the present embodiment, air gaps (or other cladding) 218 are provided between the lenslet array 214 and the first surface 206 as well as between the micro-mirror array 216 and the second surface 208.

As with the solar energy system 192 and 172 discussed above, the waveguide portions 204 and associated components (e.g., the PV cells 212) can be laterally shifted relative to the lens components of the device, namely, laterally shifted relative to both the lenslet array 214 and the micro-mirror array 216 hack and forth along a direction represented by an arrow 220. When in the position shown in FIG. 13, incident light 222 that is parallel to an axis 230 normal to the slab waveguide 205 (that is, perpendicular to the surfaces 206, 208) initially impinges the solar energy system 202 at the outer surface of the lenslet array 214, after which it passes through the lenslet array (which causes some focusing of the light), through the air gap 218 between that lenslet array and the waveguide portions 204, through the waveguide portions including the slab waveguide 205, through the additional air gap 218 between the waveguide portions and the micro-mirror array 216 and up to an outer surface 224 of the micro-mirror array. As with the solar energy system 192, at this point the light is reflected by the micro-mirror array 216 hack inward towards the slab waveguide 205 and eventually passes through the slab waveguide and to appropriate ones of (in this example, one of) the prism facets 210, as a result of which the light experiences TIR and proceeds to the PV cells 212.

Further, as shown in FIG. 14, with an appropriate lateral shifting of the waveguide portions 204 (and PV cells 212) relative to the lenslet array 214 and the micro-mirror array 216, incident light 226 that is tilted relative to the axis 230 is largely also directed eventually to the PV cells 212. As illustrated. While most of the tilted incident light 226 eventually finds its way to the PV cells 212, a small amount of light is vignetted light 231 and escapes the system 202. As with respect to the embodiments discussed with reference to FIGS. 8-12, the solar energy system 202 can achieve successful coupling of incident light to the PV cells 212 for incident light that is tilted at a variety of angles, it being understood that as the degree of tilting increases the degree of shifting will also need to increase. It will be understood that, in any given embodiment, it is possible for one or more actuators to be controlled to move waveguide portions relative to lens array structures (including multiple structures such as both the lenslet array 214 and the micro-mirror array 216), with those lens array structures being stationary, or vice-versa, or to move all of the different components in various directions.

In the above-described embodiments of solar energy systems, PV cells are positioned along edges of slab waveguides so as to receive light directed by the slab waveguides to and outward form those edges. However, the confining of light at known angles within waveguides as is achieved in such solar energy systems does not mandate that PV cells be oriented in such manners to receive that light. Rather, depending upon the embodiment, additional arrangements are possible that allow for repositioning of PV cells or light extraction in a manner that achieves additional concentration. More particularly, referring now to FIGS. 15-18, solar energy systems such as those discussed above can be modified in additional manners that facilitate the communication of light within the slab waveguides to PV cells that are intended to receive that light that are positioned in a variety of manners, and/or facilitate light extraction in a manner by which greater concentration is achieved.

Figure 15:
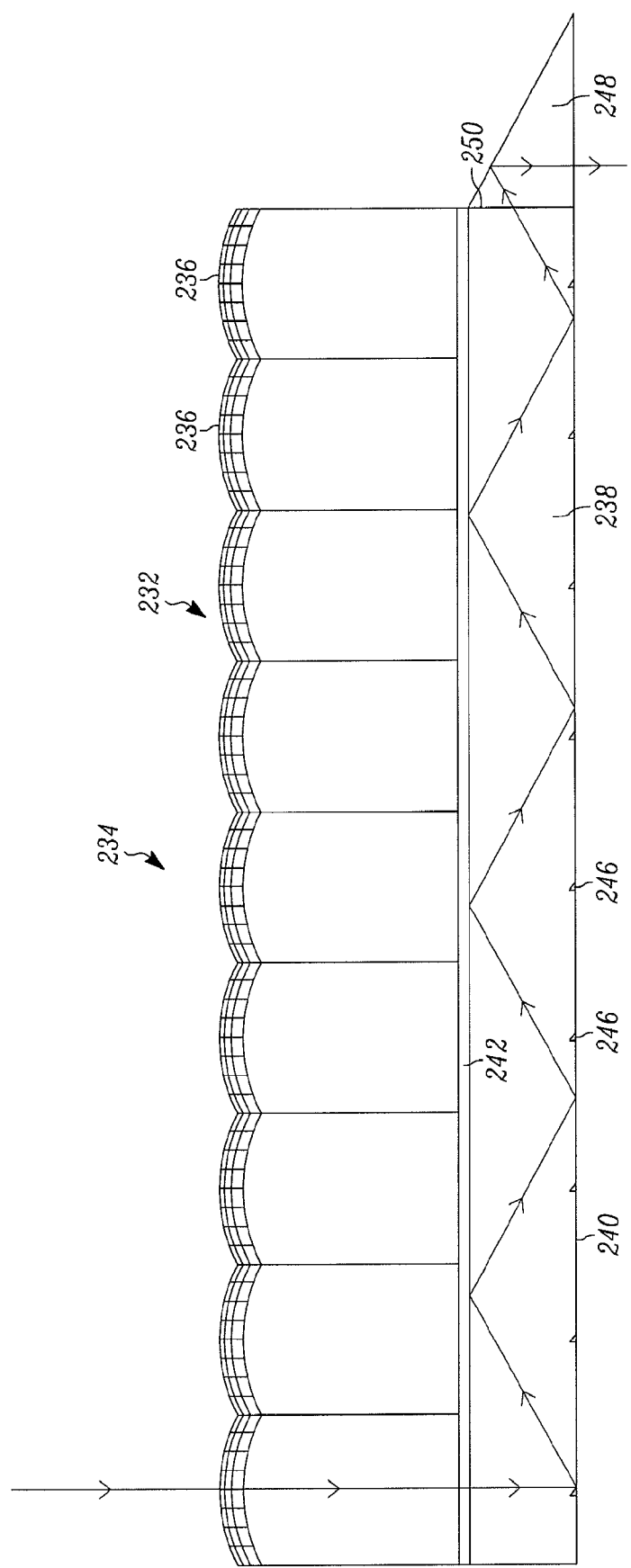
FIGS. 15-17 are additional schematic, cross-sectional elevation views of further exemplary embodiments of solar energy devices that allow for differ manners of extraction of light from waveguides of the solar energy devices.

For example, with respect to FIG. 15, a modified version of the solar concentration section 4 of the solar energy system 2 of FIG. 2, referred to as a solar concentration section 234, is shown. The solar concentration section 234 in particular has, as shown, not only a lens array 232 with a plurality of lenses 236 as well as a slab (uniform-thickness) waveguide 238 having an outer surface 240, an inner surface 242 and a plurality of prism facets 246, but also additionally a fold prism 248 positioned at an edge 250. The fold prism 248 serves to rotate the light emanating from the waveguide 238 from lateral to downward propagation (e.g., a 90 degree rotation), which allows a PV cell (not shown) to be placed underneath the waveguide so as to be parallel to the outer surface 240 of the waveguide 238 rather than along the edge 250 of the waveguide.

Figure 16:
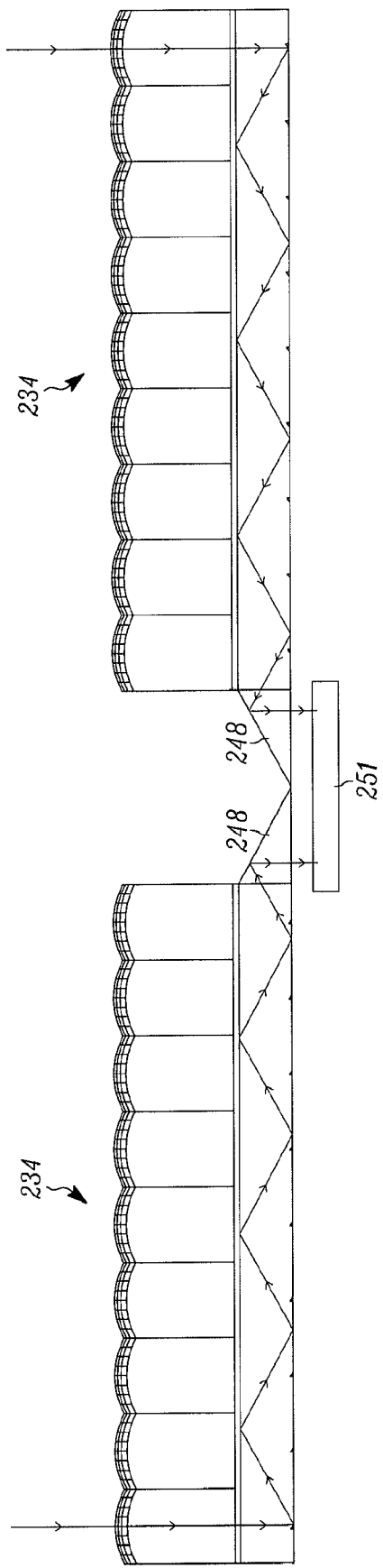

Referring additionally to FIG. 16, through the use of multiple solar energy systems each employing the solar concentration section 234 of FIG. 15, further concentration of light for reception by a PV cell (and/or ease of manufacture of the overall solar energy system) can be achieved. For example, by positioning two of the solar concentration sections 234 end-to-end, where the sections include respective fold prisms 248, light from the two solar concentration sections 234 can be directed to a single PV cell 251. Thus, only the single PV cell 251 is necessary for capturing light from two of the sections 234. It will be understood that, in further embodiments, more than two (e.g., 4) solar concentration sections can effectively share the same PV cell in a similar manner.

Figure 17:
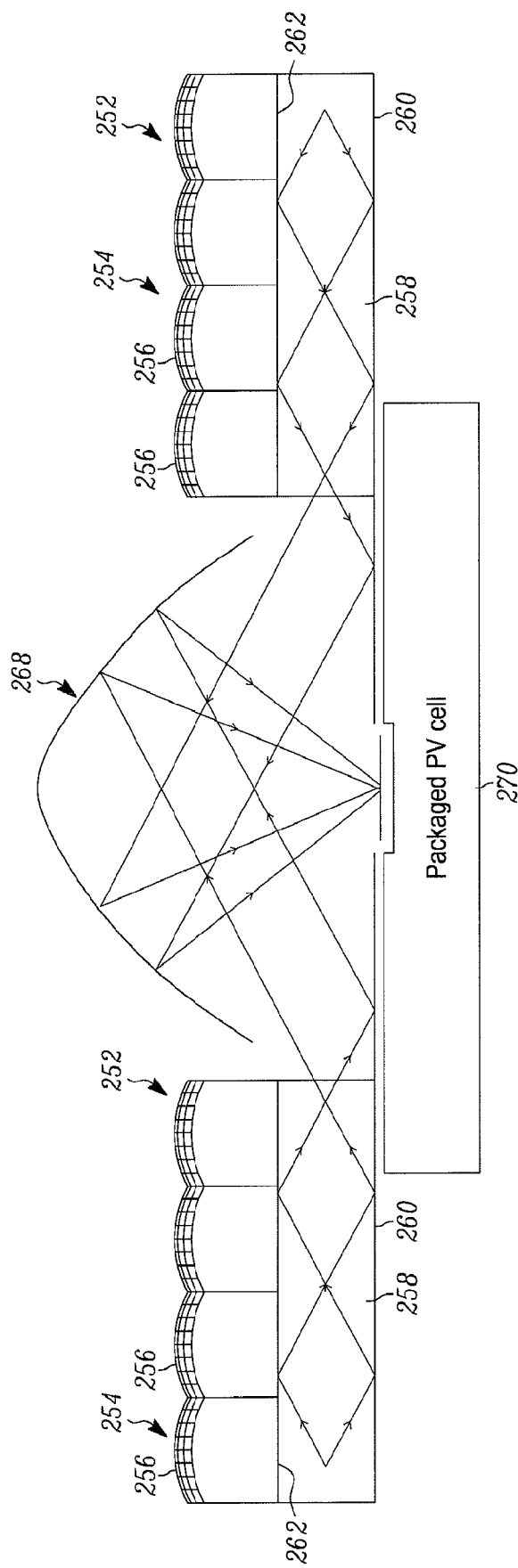

Referring to FIG. 17, portions of another exemplary solar energy system are shown. In this embodiment, the solar energy system includes two solar concentration sections 254. As with the solar concentration section 234, each of the solar concentration sections 254 again includes a respective lens array 252 with a respective plurality of lenses 256 as well as a respective slab (uniform-thickness) waveguide 258 having a respective inner surface 262 and a respective outer surface 260, along which are formed a respective plurality of prism facets (not shown). Each solar concentration section 234 can have a thickness (that is, as measured between the outer surface of the lens array 252 and the outer surface 260) of, for example, 2 millimeters. Additionally, positioned between the solar concentration sections 254 is a curved mirror reflector 268 oriented so as to be concave toward the plane of the inner surfaces 262. The curved mirror reflector 268 can be any of a variety of different curved shapes depending upon the embodiment and, for example, can be an aspheric mirror reflector or a curved mirror reflector. In the present embodiment, the curved mirror reflector 268 extends outward away from the waveguides 258 farther than do the lens arrays 252, although this need not be the case in all embodiments.

The curved mirror reflector 268 receives light provided to it from the waveguides 258 as that light proceeds out of the ends of the waveguides, and in turn focuses the light toward a central location 266 between the solar concentration sections 254 generally along the plane determined the outer surfaces 260. Again, as with respect to the system of FIG. 16, a packaged PV cell 270 can be positioned at this central location as shown so as to receive the focused, concentrated light. Thus, both the fold prisms 248 and the curved mirror reflector 268 of FIGS. 16 and 17, respectively, serve to rotate the light emanating from the waveguides 238, 258, from lateral to downward propagation, albeit the curved mirror reflector provides the added benefit of further concentrating the light for receipt by the PV cell 270. Such concentration not only allows potentially the use of a smaller PV cell (which is desirable, due to the cost of larger PV cells), but also allows the PV cell to be more effectively operated (typically, PV cells achieve greater efficiency of operation upon receiving more intense light).

Figure 18:
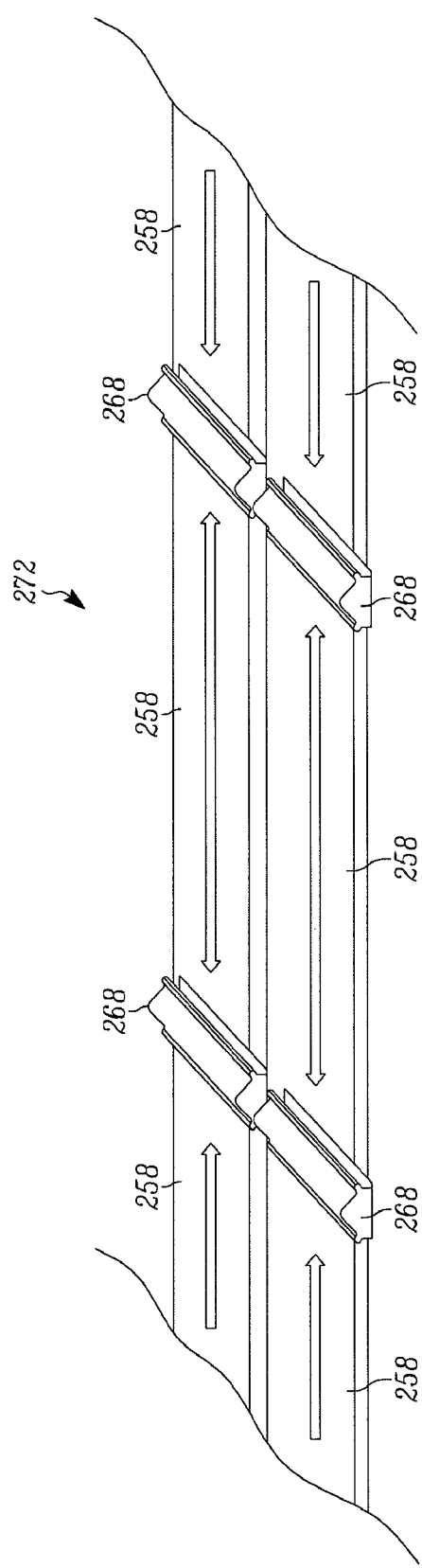
FIG. 18 is an additional schematic, perspective view of a solar energy system in the form of a planar concentrator array.

In view of the embodiments of FIGS. 15-17, it should be further evident that, depending upon the embodiment, two (or more) opposing solar concentration sections can be joined so as to couple bi-directional (or multi-directional) light into a common PV cell. Also, symmetric couplers enable linear arrays of micro-optic concentrators. Referring additionally to FIG. 18, for example, a planar concentrator array 272 is shown in cutaway to include six solar concentration sections 254 of the type shown in FIG. 17 (the waveguides 258 being shown in particular) and four of the curved mirror reflectors 268, with each of the reflectors being positioned between two corresponding ones of the solar concentration sections (where to of those sections are between two of the reflectors). The curved mirror reflectors 268 direct light received from the solar concentration sections to PV cells (not shown) positioned beneath four different curved mirror reflectors 268. Notwithstanding the particular structure shown, it will be understood that any arbitrary number of solar concentration sections and curved mirror reflectors of this type can be assembled into a larger structure in this manner. Such a structure is not only easy and convenient to fabricate but also in some cases can be easily stored (e.g., the planar array can potentially be rolled up).

As already mentioned, increased concentration of light onto a given PV cell can improve the performance of the PV cell. Output coupler designs such as those discussed above using curved (e.g., aspheric or parabolic) mirrors (instead of planar fold prisms) are particularly capable of remapping guided ray angles and focusing light onto a given PV cell. Additionally it can be noted that reactive surfaces with optical power enable another stage of concentration in addition to the increased flux gained from coupling light into the waveguide. Combining two methods of concentration allows the system to efficiently reach high levels of flux needed for multi-junction PV cells. Many potential designs have been explored and vary based on the waveguide modes, yet most embodiments utilize at least one curved mirror to collect diverging light as it leaves the waveguide.

An additional factor influencing the performance of a PV cell is the degree to which the PV cell is suited to receiving the particular light spectra that are provided to it. Turning next to FIGS. 19-23, in at least some embodiments of the present invention, solar energy systems are configured to differentiate between/among different light spectra and to direct different light components to different PV cells that are particularly well-suited for receiving those respective light components. In at least some such embodiments, dielectric mirrors are incorporated into the solar concentrator design to split broad spectrum illumination into multiple bands for collection using specialized PV cells.

Figure 19:
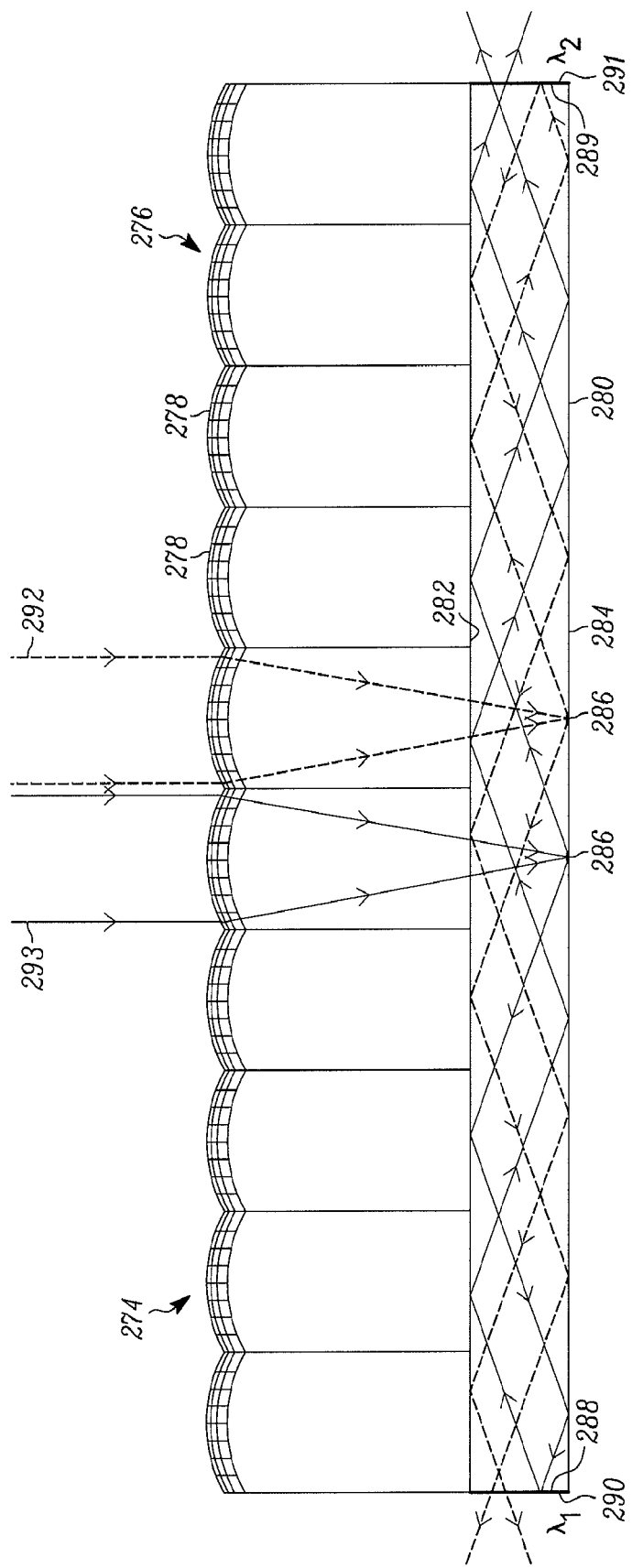
FIGS. 19-23 are additional schematic, cross-sectional elevation views of further exemplary embodiments of solar energy devices that allow for various spectral components of light to be directed to different PV cells.

Referring to FIG. 19, in one such embodiment a solar concentration section 274 is employed. The solar concentration section 274, as shown, is similar to the solar concentration section 4 of FIG. 2 insofar as it employs a lens array 276 having multiple lenses 278 placed adjacent to a slab waveguide 280. The slab waveguide 280 can, as was the case with the slab waveguide 18 of FIG. 2, include inner and outer surfaces 282 and 284, respectively, with the inner surface 282 being adjacent to the lens array 276 (it being further understood that a low index cladding layer such as the layer 16 of FIG. 1 serves as this inner surface 282), and prism facets 286 (two of which are shown) being formed along the outer surface 284. PV cells (not shown) can be provided along outer edges 288 and 289 of the slab waveguide 280. In contrast to the solar concentration section 4, however, the solar concentration section 274 additionally includes first and second dichroic mirrors 290 and 291 that are respectively positioned along the first and second edges 288 and 289, respectively (and which would therefore be positioned between those edges and any RV cells intended to receive light emanating through those edges).

As shown in FIG. 19, the dichroic mirrors 290, 291 are particularly configured to pass certain way lengths of light and to reflect other wavelengths of light. In the present example, first incident light 292 of wavelength $\lambda_1$ (shown in dashed lines), upon impinging the lenses 278 and passing into the slab waveguide 280 and being reflected by a respective one of the prism facets 286, experiences TIR within the slab waveguide 280 and can proceed in either direction towards the first edge 288 or the second edge 289. However, assuming that the dichroic mirror 291 is reflective with respect to light of wavelength $\lambda_1$, any such light that arrives at the second edge 289 is consequently reflected by the dichroic mirror 291 and thus proceeds in the opposite direction toward the first edge 288. Assuming that the first dichroic mirror 290 is configured to allow light of wavelength $\lambda_1$ to pass through that dichroic mirror, all of the light of that wavelength then proceeds out of the first edge 288 and through that dichroic mirror 290. To the extent that a PV cell (not shown) is positioned on the opposite side of that dichroic mirror 290, that PV cell only receives light of the wavelength $\lambda_1$. Assuming that such PV cell is selected so as to be particularly suited for receiving light of this wavelength, the efficiency of operation of the PV cell can be maximized.

In contrast, with respect to second light 293 of wavelength $\lambda_2$ that is incident upon the lenses 278 (shown in solid lines), that light also can proceed in through the lenses and into the slab waveguide where it experiences TIR due to interaction with the prism facets 286. However, in this case, the first dichroic mirror 290 is configured to reflect light of the wavelength of the second light ($\lambda_2$) while the second dichroic mirror 291 is configured to pass such light. Thus, all of the second light of the wavelength $\lambda_2$ only passes out of the waveguide through the edge 289 through the dichroic mirror 291 and, upon making such passage, can be received by a PV cell that desirably is suited for receiving light of that frequency.

Figure 20:
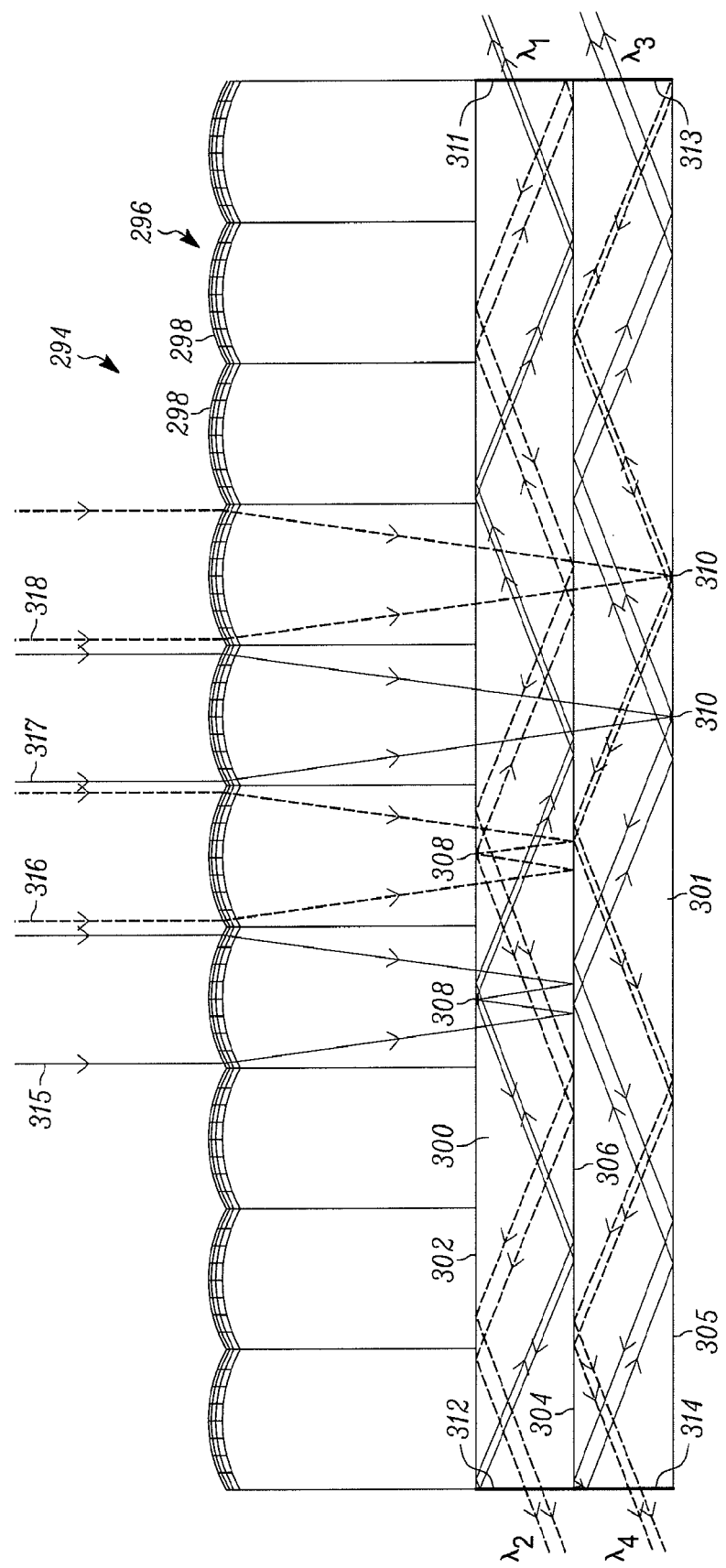

The above-described features of the solar concentration section 274 of FIG. 19, in which light is selectively reflected or passed at the edges (exit apertures) of a waveguide depending upon the wavelength of the light, can be further combined with additional light-selective operation as shown in FIG. 20. More particularly, as shown in FIG. 20, an additional embodiment of a solar concentrations section 294 includes not only a lens array 296 with lenses 298 but also a first waveguide 300 and a second waveguide 301. The first waveguide 300 has a first surface 302 and a second surface 304, where the first surface 302 is in contact with the lens array 296 and the second surface 304 is in contact with the second waveguide 301. The second waveguide 301 includes a first surface 305 that is an outermost surface of the solar concentration section 294 and additionally a second surface 306 that is in contact with the second surface 304. The first surface 302 of the first waveguide 300 can be formed by a low index cladding layer such as the cladding layer 16 of FIG. 1. However, in contrast to the embodiment of FIGS. 1-2, prism facets 308 (two of which are shown) are formed not along the second surface 304 of the waveguide 300 but rather along the first surface 302 that is in contact with the lens array 296.

Instead of placing prism facets at the second surface 304, that surface instead is where a dichroic mirror (as well as possibly another cladding layer) is formed and, for purposes of the description below, the second surface 304 is considered to be such a dichroic mirror (albeit the second surface 306 of the second waveguide 301 or both of the surfaces 304, 306, can also be considered to be or include such a mirror). As for the second waveguide 301, it also has prism facets 310, two of which are shown, formed along the first (outer) surface 305. Additionally as shown, at each of the longitudinal edges of the first and second waveguides 300, 301, further dichroic mirrors are placed in the same manner as was described with respect to FIG. 19. Thus, at a right edge (as shown in FIG. 1) of the first waveguide 300 a first dichroic mirror 311 is positioned while at a left edge of that same waveguide a second dichroic mirror 312 is positioned. Likewise, at a right edge of the second waveguide 301 a third dichroic mirror 313 is positioned while at a left edge of that waveguide a fourth dichroic mirror 314 is positioned.

Given the above-described arrangement, the solar concentration section 294 is capable of differentiating among four different types of light and directing those respective types of light to four different PV cells respectively. More particularly, first light 315 of wavelength $\lambda_1$ that is incident upon the lenses 298, upon passing through the lens array 296 and passing into the first waveguide 300, is reflected by the dichroic mirror 304 and consequently reflected back up to appropriate ones of (in this example, one of) the prism facets 308 associated with that first waveguide. Likewise, second light 316 of wavelength $\lambda_2$ (shown in dashed lines) upon passing into and through the lens array 296 and into the first waveguide 300 similarly is reflected by the dichroic mirror 304 and received at the prism facets 308. Upon reaching the prism facets 308, each of the first and second light 315, 316, experiences TIR and is reflected within the first waveguide 300. Due to the additional operation of the first and second dichroic mirrors 311, 312 (in substantially the same manner as was discussed with respect to FIG. 19), however, the first light of wavelength $\lambda_1$ is reflected by the second dichroic mirror 312 so that it cannot pass out of the waveguide 300 at its left edge, but instead all of the first light passes through the first dichroic mirror 311 and thus exits the waveguide through its right edge. Conversely, the second light 316 of wavelength $\lambda_2$ is precluded from exiting the first waveguide 300 at its right edge associated with the first dichroic mirror 311, at which such light is reflected, but is instead able to exit the first waveguide at its left edge at which is located the second dichroic mirror 312, which passes that light.

In contrast to the first and second light 315, 316 that is reflected by the dichroic mirror 304, both third light 317 of wavelength $\lambda_3$ and fourth light 318 of wavelength $\lambda_4$, upon entering the lens array 296 and passing through the first waveguide 300, are able to pass through that dichroic mirror and into the second waveguide 301. Upon passing into the second waveguide 301, the focused light 317, 318 reaches the prism facets 310, at which that light experiences TIR. Due to the presence of the dichroic mirror 304 (and possibly due to any further effect of any other layer such as a low index cladding layer at the second surface 306, etc.), the third and fourth light cannot re-enter the first waveguide 300. Rather, due to the operation of the third and fourth dichroic mirrors 313, 314, the third light 317 is reflected at the left edge of the waveguide 301 and only passes out of that waveguide at its right edge by way of the third dichroic mirror 313. While the fourth light 318 is reflected at the right edge of the waveguide 301 and only passes out of that waveguide at the left edge by way of the fourth dichroic mirror 314. Thus, given the embodiment shown in FIG. 20, incident light can be separated successfully into four different light components $\lambda_1$, $\lambda_2$, $\lambda_3$ and $\lambda_4$, which respectively exit the solar concentration section at four different locations. Assuming that respective PV cells are placed adjacent to the respective dichroic mirrors 311-314 (or otherwise in position so as to receive light emanating through those respective dichroic mirrors) that are suited for receiving the particular light components emanating from those respective dichroic mirrors, enhanced operation of the PV cells and thus of the entire solar energy system 294 can be achieved.

Figure 21:
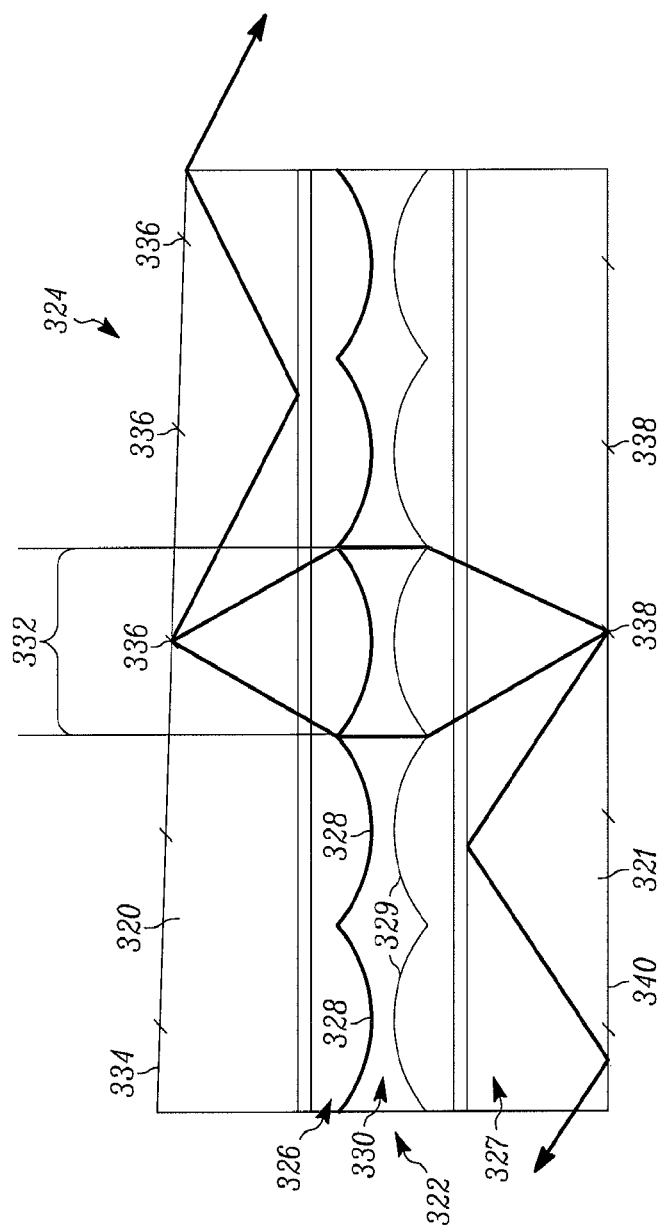

Referring next to FIG. 21, another exemplary solar concentration section 324 is shown in which incident light 332 is separated into different light components suitable for receipt by different PV cells. As shown, the solar concentration section 324 of FIG. 21 like the solar concentration section 294 of FIG. 20 includes a first waveguide 320, which can be, for example, an infrared waveguide, and a second waveguide 321, which can for example be a visible waveguide (again, each of the waveguides can include appropriate cladding along its outer surfaces so as to form the waveguides; also, there can be in some cases a planar first surface anti-reflective coating applied to various surfaces of the solar concentration section 324). In this embodiment, however, rather than employing a lens array that receives incident light prior to that incident light being transmitted to the waveguides, the solar concentration section 324 instead employs a lens array 322 that is positioned in between the first and second waveguides 320, 321. More particularly as shown, the lens array 322 includes a first lens subarray 326 that includes a plurality of lenses 328 that are directed concave up toward the first waveguide 320 and a second lens subarray 327 having a plurality of lenses 329 that are directed concave down towards the second waveguide 321. As shown, the second lens subarray 327 is thus closer to the second waveguide 321 than the first waveguide 320, and the first lens subarray 326 is thus closer to the first waveguide 320 than the second waveguide 321, where a space 330 exists between the first and second lens subarrays.

Further as shown, the first lens subarray 326 more particularly is coated with a dichroic coating such that the lenses 328 of that subarray serve as reflective lenses (or mirrors) in relation to infrared light while passing non-infrared (and in particular visible) light. In contrast, the lenses 329 of the second lens subarray 327 are not coated with any dichroic coating but merely serve as refractive lenses for any light (and particularly visible light) that reaches those lenses after passing through the reflective lenses of the first lens subarray 326. Given this arrangement, upon incident light 332 impinging the solar concentration section 324 via an outer surface of 334 of the first waveguide 320, that light proceeds through the first waveguide 320 and into the lens array 322. Infrared light components of the incident light 332 are reflected by the lenses 328 of the first lens subarray 326 and, due to the focusing of those lenses, arrive at prism facets 336 formed along the outer surface 334 of the first waveguide. Upon being reflected at those prism facets 336, the infrared light experiences TIR and proceeds to the edges of the waveguide where the light can then proceed to PV cells (not shown).

By comparison, other light and particularly visible light entering into and passing through the first waveguide 320 passes through the lenses 328 of the first lens subarray 326 and into the lenses 329 of the second lens subarray 327. This light is then focused so as to reach prism facets 338 along an outer surface 340 of the second waveguide 321. Upon reaching the prism facets 338, the visible light experiences TIR and thus proceeds within the waveguide 321 to edges at which the light can exit the waveguide and be received by PV cells (again not shown). It should be noted that the embodiment of FIG. 21 is capable of achieving a unique lens power and concentration for each light band provided, assuming that there is normal incidence upon the dichotic reflectors.

Figure 22:
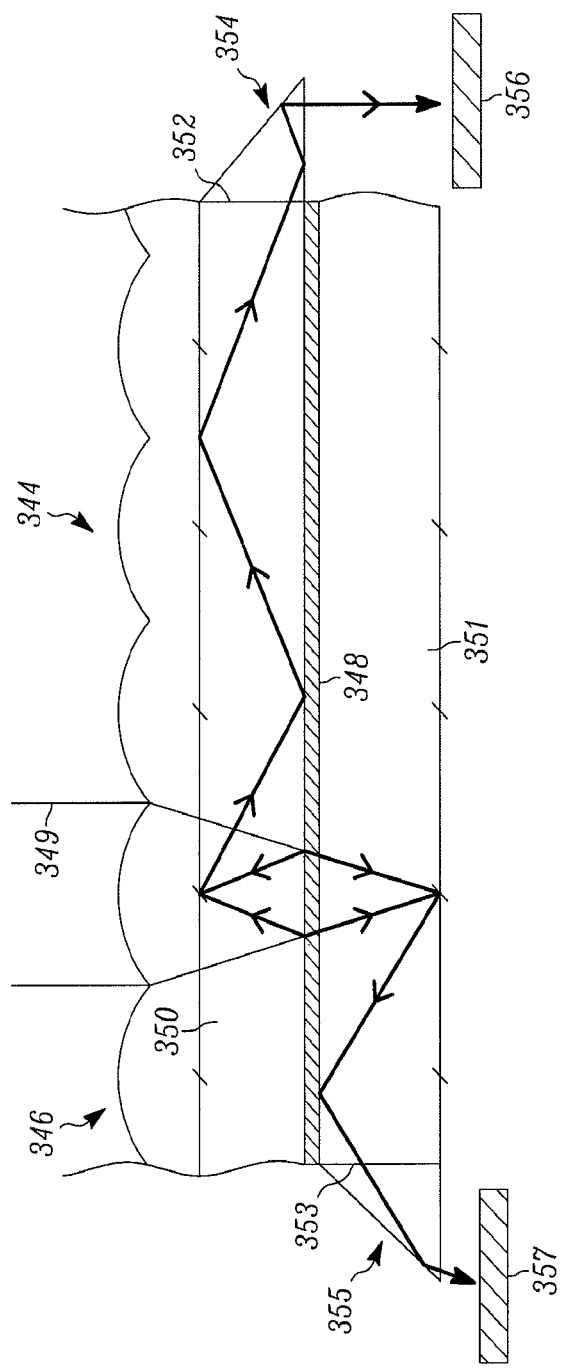

Various combinations of two or more of the features described above can also be encompassed in additional embodiments of the present invention. For example, as shown in FIG. 22, in one embodiment a solar concentration section 344 is substantially identical to the solar concentration section 294 of FIG. 20 insofar as it includes a lens array 346, a first waveguide 350 and a second waveguide 351, along with a dichroic mirror 348 positioned in between the two waveguides. Again, given this design, when incident light 349 impinges the solar concentration section 344, certain light components (e.g., infrared light) are reflected back into the first waveguide 350 and experience TIR within that waveguide while other wavelength components are passed through the dichroic mirror into the second waveguide 351 and experience TIR in that waveguide. Although not shown, it will be understood that dichroic mirrors can also be positioned along the edges of the waveguides 350, 351 to further determine whether particular light components within the respective waveguides exit the waveguides at any particular longitudinal edges, although this need not be the case in all embodiments.

Unlike the solar concentration section 294 of FIG. 20, however, each of the waveguides 350, 351 of the solar concentration section 344 is shown to include a respective longitudinal edge 352, 353, respectively, at which is positioned a respective folding prism 354, 355, respectively, as discussed above in relation to FIG. 15 (in alternate embodiments, reflectors can be employed in place of the folding prisms). As a result of the folding prism 354, the light emanating from the first waveguide 350, which can be infrared light, is directed to a first PV cell 356 that is suited for receiving such light and that is positioned so as to extend parallel to the dichroic mirror 348 (that is, parallel to the waveguides 350, 351) while light emanating from the second waveguide 351 is directed to a second PV cell 357 that is suited for receiving such light (e.g., visible light). Thus, in the embodiment of FIG. 22, the solar concentration section 344 achieves some of the same benefits of each of the solar concentration sections of FIG. 20 and FIG. 15, both in terms of concentrating light and directing certain light components to suitable PV cells, as well as arranging PV cells so as to be positioned in a desirable manner (and a manner in which the different PV cells are positioned apart from one another). This embodiment can further allow for the development of thin/small volume solar energy systems, and systems with improved polarization performance.

Figure 23:
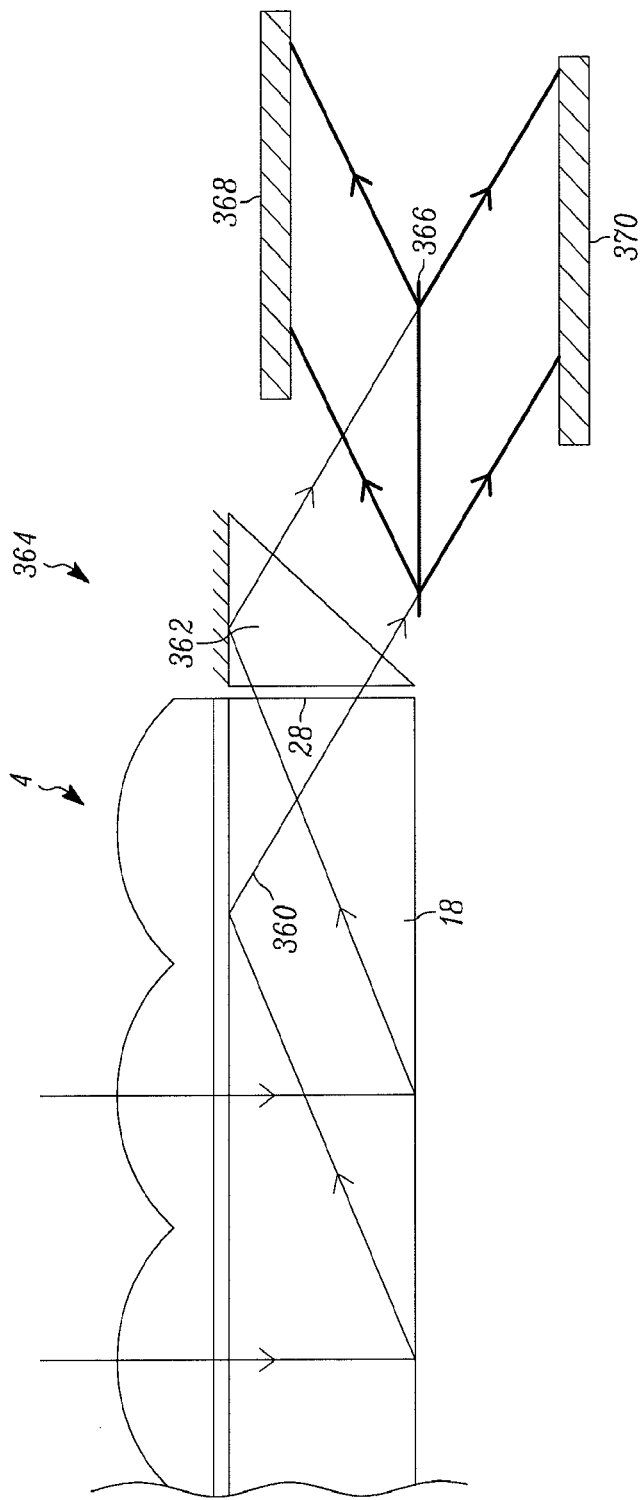

Referring farther to FIG. 23, an additional solar concentration section 364 includes both the solar concentration section 4 of FIGS. 1-2 as well as additional components that allow for the separation of different light components and direction of those respective light components to different PV cells. More particularly as shown, in the embodiment of FIG. 23, a reflective output coupler 362 is positioned at an edge 28 of the waveguide 18 as shown and in turn directs the received light 360 to a dichroic reflector 366 that is located outside of the solar concentration section 4. Due to the external dichroic reflector 366, certain light components (e.g., infrared light) are further reflected in a first direction toward a first PV cell 368 suitable for receiving that light while other light components are passed through the dichroic reflector and received by a second PV cell 370 suitable for receiving those light components. This embodiment thus provides a simple concentrated design, where a concentration ratio can be reduced by a factor of z. To the extent that a common output angle from multimode waveguide is desired, this can require additional reflection.

In view of the above, it should be noted that at least some embodiments of the present invention achieve primary concentration of light by collecting light over an entire lens array aperture and confining the energy within a waveguide of constant thickness. The geometric concentration is therefore the waveguide length divided by the waveguide slab thickness (or twice the thickness where there exists symmetric coupling). Yet the aforementioned analysis of the concentration value assumes no focusing in the orthogonal direction, that is, the direction perpendicular to the thickness of the waveguide (e.g., as measured along the normal axis 159 discussed above) and also perpendicular to the length of the waveguide along which captured light generally proceeds toward one or more PV cells. Nevertheless, focusing in the orthogonal direction can also be achieved in various manners and can result in additional light concentration.

Figure 24B:
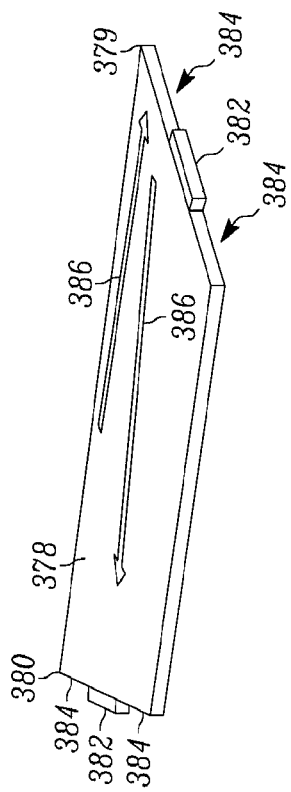
Figure 24A:
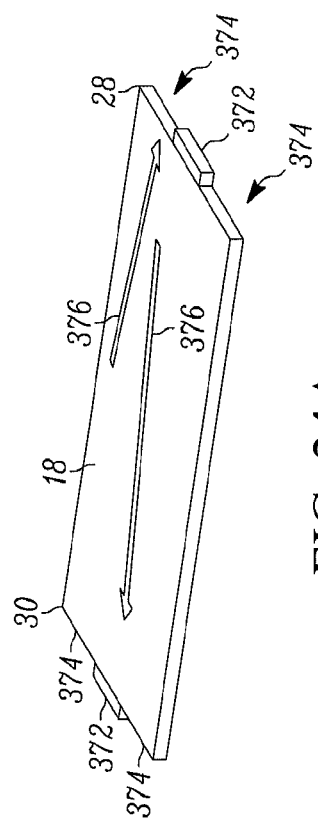
Figure 24D:
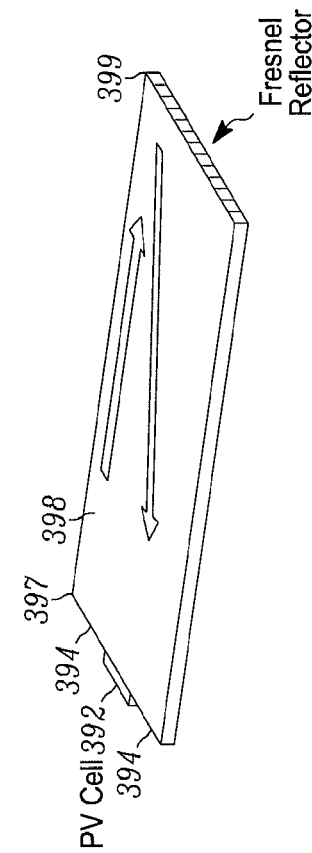

Referring to FIGS. 24A-24D for example, in at least some embodiments the PV cells need not occupy the entire widths of the edges of the waveguides along which those PV cells are positioned. That is, the exit apertures (the portions of the edges of the waveguides along which PV cells are positioned) need not be coextensive with the edges of the waveguides. For example, with respect to FIG. 24A, the slab waveguide 18 of FIG. 1 having the first and second edges 28 and 30 need not be employed in conjunction with PV cells that extend the full width of the waveguide as do the PV cells 6 of FIG. 1. Rather, as shown in FIG. 24A, PV cells 372 can instead be employed that only extend approximately one-third of the width of the waveguide 18. Assuming that mirrors 374 are positioned along the remaining portions of the edges 28, 30 that are not covered by the PV cells 372, light within the waveguide 18 that is not incident upon the PV cells continues to reflect back and forth within the waveguide 18 as represented by arrows 376 until such time as the light enters into one of the PV cells 372. (A similar arrangement can be employed to achieve separation of different light components from one another). By reducing the size of the PV cells (and exit apertures) relative to the longitudinal waveguide edges in this manner, the geometric concentration ratio is increased.

By comparison, FIG. 24B also includes a waveguide 378 that has first and second edges 379 and 380, respectively, and PV cells 382 and mirrors 384 along each of the respective edges, where the PV cells occupy about one-third of the widths of each of those respective edges and the mirrors along those edges occupy the remainders of the widths of those respective edges. In contrast to the embodiment of FIG. 24A, however, the edges 379, 380 of the waveguide 378 are not parallel to one another but rather are tapered such that the overall waveguide has a trapezoidal shape as viewed normal to the waveguide (that is as viewed along the axis 159 discussed above). By properly selecting the angles of such tapered edges, reflection of the light (again as represented by arrows 386) can be achieved that more rapidly results in arrival in the light at the PV cells 382 than in the case of FIG. 24A. Although a trapezoidal arrangement is shown in FIG. 24B, it will be understood that other shapes are also possible including, for example, parallelogram arrangements or arrangements in which the edges of the waveguide are curved. In each case, the edge configurations are selected so as to alter the reflection angles of the light being reflected off of the mirrors along the edges of the waveguide so as to increase the likelihood of reflections toward the PV cells and thus the likelihood of capture of that light by the PV cells.

Figure 24C:
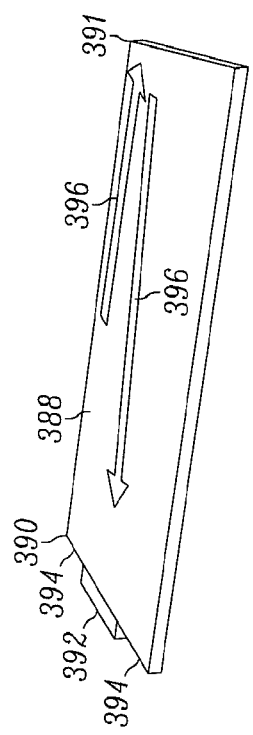

FIG. 24C shows yet another waveguide 388. In this embodiment, a PV cell 392 is only located along a first edge 390 of the waveguide while an opposite edge 391 of the waveguide is a mirror such that no light exits the waveguide at that edge. Thus, in such an embodiment, light is reflected not only by mirrored surfaces 394 existing along the first edge 390 at which is located the PV cell 392 (which as in the cases of FIGS. 24A-24B does not occupy the entire width of the edge) but also is reflected at the mirrored edge 391, as indicated by arrows 396. As for FIG. 24D, still an additional waveguide 398 is shown that also has the PV cell 392 and mirrored portions 394 along a first edge 397 but, instead of having a mirrored edge 391 as in FIG. 24C instead has an edge 399 that is a Fresnel reflector or retroreflector (in the present embodiment, the Fresnel reflector is a planar Fresnel reflector). Again, in the embodiments of FIGS. 24C and 24D, increased concentration of light upon the PV cell 392 results. Further, from FIG. 24C it is apparent that a single PV cell can be used with symmetric coupling by mirroring one entire exit aperture of the slab waveguide, while as evidenced by FIG. 24D the use of other types of mirrors/prisms at one edge of the waveguide can also be provided in some embodiments, for example, where it is desired to achieve effectively the effect of a curved mirror on a planar surface.

Turning to FIGS. 25-28B, control or influence over the direction of light proceeding within a waveguide such as the waveguides discussed above can be achieved not only through the use of mirrors and lenses but also by appropriate selection/configuration of the prism facets as well. In particular, every given prism facet can be configured to tend to direct/reflect light in a particular direction. Referring to FIG. 25, a schematic diagram illustrates one exemplary waveguide 400 within which are positioned numerous prism facets 402. As shown, each of the prism facets 402 is configured to direct/reflect light predominately in a direction indicated by a respective arrow emanating from that prism facet. Further, as can be seen from FIG. 25, given appropriate selection of such directional orientations of the prism facets 402, light from all of the prism facets can be directed generally towards a PV cell 404 located at a given edge 406 of the waveguide 400.

Additionally, given the ability of prism facets to not only tilt rays for the purpose of achieving TIR but also for the purpose of orientating/directing light towards a given region a waveguide (e.g., toward a given edge or exit aperture of a waveguide, FIGS. 26A-26C show how appropriate selection of the prism facets can be used to achieve direction of light towards any arbitrarily-located PV cell positioned along an edge of a waveguide. More particularly, each of FIGS. 26A-26C show respective exemplary waveguides 410, 420, and 430, respectively, at which first, second and third PV cells 415, 425 and 435, respectively, are located at first, second and third positions along respective edges of the respective waveguide. Although prism facets are not shown with particularity in FIGS. 26A-26C, it will be noted that tangent curves 417, 427 and 437 are shown instead. So long as the prism facets are configured to direct light in directions perpendicular to the respective tangent curves 417, 427, and 437, in respective FIGS. 26A, 2613 and 26C (and within the longitudinal plane of the waveguides), light will be generally directed towards the respective PV cells 415, 425, 435 along directions generally indicated by respective arrows 419, 429 and 439, respectively. With respect to FIG. 26C specifically, it should be further noted that two PV cells 435 are positioned along both opposite edges of the waveguide 430, and it will be noted that there exists symmetry in the tangent curves 437 shown with respect to opposite halves of the waveguide. Layout of the prism facets in the manner shown in FIG. 26C can facilitate the manufacturing of numerous waveguides since the prism facet pattern is repetitive/cyclic (and thus the numerous waveguides can be manufactured in any role type fashion).

Figure 28A:
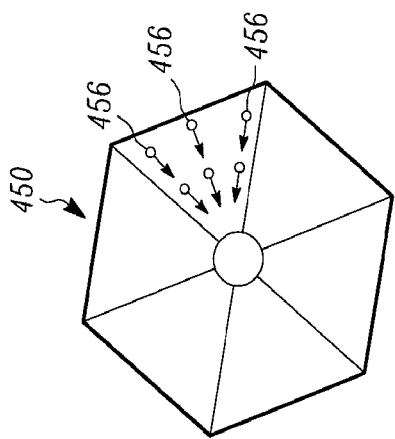
Figure 28B:
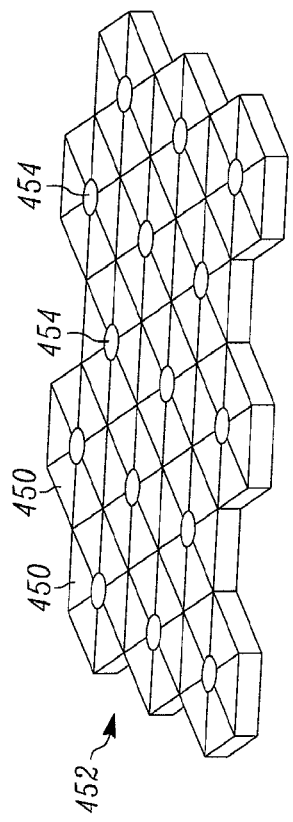
Figure 27:
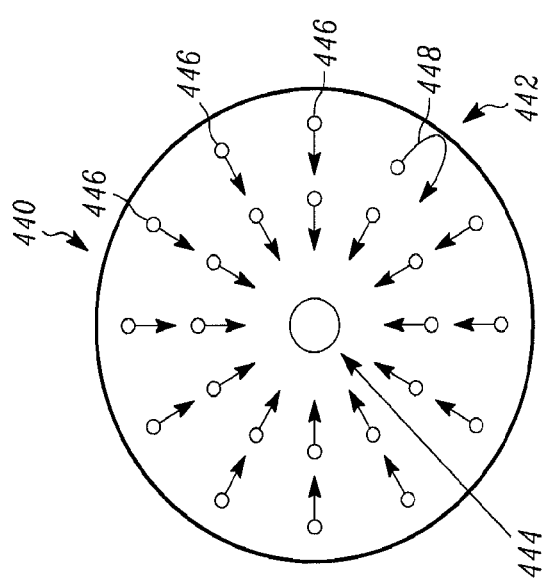

Although the above description largely presumes that slab waveguides are employed and that PV cells need to be positioned along edges of slab waveguides, as illustrated in FIGS. 27-28B, this need not be the case in some embodiments. Indeed, the present invention is intended to encompass a variety of embodiments having a variety of different types and shapes of waveguides. For example, not only six-sided slab waveguides (or slab waveguides with six edges) but also slab waveguides with more than six sides/edges can be employed in some embodiments. Also, in some embodiments, the waveguides need not have sides/edges that are all flat, but instead can include one or more sides that are curved.

Further, given appropriate prism facet configuration, light direction can be controlled to such an extent that light can be effectively coupled to PV cells even though the PV cells merely occupy minor regions along one or more of the non-edge surfaces (e.g., the surfaces 22, 24 of the waveguide 18 of FIG. 1) of the waveguide.

Particularly as illustrated in FIG. 27, it is even possible to provide a circularly-shaped waveguide 440 having an outer cylindrical edge 442 that is mirrored/reflective that effectively directs light to an off-edge PV cell 444 by appropriately configuring prism facets 446 along that waveguide so as to direct light in the directions shown by arrows emanating from those prism facets, that is, in directions toward the location of the PV cell. Due to the orientation of the prism facets 446, light is strongly directed toward the PV cell at the center of the waveguide. Further due to the mirrored edge 442, light is also reflected inward away from the outer cylindrical circumference as indicated by an arrow 448. As the light reflects back and forth between the various surfaces of the waveguide 440 it eventually proceeds to the location of the PV cells 444. The particular location of the PV cells 44 in terms of whether it is located on any particular one of the two non-edged surfaces (that is, the surfaces corresponding to the surfaces 22, 24 of FIG. 1) is not critical due to the number of reflections that the light within the waveguide 440 undergoes. In particular, there is no need for the PV cell to extend into the waveguide in order for the PV cell to satisfactorily receive light.

Given the ability to direct light within a given slab waveguide by way of the prism facets (and also complementary mirrored surfaces), not only can a radial concentrator be realized having a single PV cell located at the center of the disk, but also in some embodiments the disk can be replaced with hexagonal sections to achieve higher fill factors between concentrator elements. As shown in FIGS. 28A-28B, a plurality of hexagonal slab waveguide portions 450 in particular can be assembled to form an overall waveguide assembly 452, where each of the waveguide portions 450 has a single associated PV cell 454 at its center toward which all light within that waveguide portion tends to be directed due to the orientation of the prism facets. Exemplary orientation of prism facets within a section of an exemplary hexagonal waveguide portion 450 is shown in FIG. 28A (particularly in a section of one such waveguide portion), with the particular configured orientations of the prism facets 456 being indicated by arrows emanating from those prism facets. It can be further noted that, in the rotationally-symmetric embodiments of FIGS. 27-28B, the design of the coupling light extractor (e.g., in terms of prism facet orientation) remains the same when rotated about a central axis.

Because directionality of light flow within waveguides can be achieved at least in part by appropriate configuration of the prism facets, light can be further directed/coupled to PV cells with fewer passes along the slab waveguide and therefore achieve even greater efficiency. In at least some embodiments of the present invention, it is envisioned that the use of prism facets to achieve directionality and greater concentration can be combined with the use of any one or more of the other above-described techniques (e.g., those involving lenses, mirrors, reflectors, light component separation, etc.) to achieve desired direction of light within a slab waveguide toward PV cells and desired concentration of that light. That is, the above-described methods involving light control using prism facets are independent of, but also combinable with, the other light-concentrating/extracting designs also described above.

In view of the above description, it should be apparent that the present invention is intended to encompass numerous embodiments having a variety of different features, and the present invention encompasses numerous variations on the particular embodiments discussed above as well. In at least some additional embodiments of the present invention, a solar energy system can employ one or more of the features shown above in relation to one of the above-described systems with other features shown above in relation to other(s) of the above-described systems. Also, one or more of the features can be modified in many different manners. For example, in some alternate embodiments, it is possible to arrange prism facets (or other injection features) along a surface of a waveguide that is adjacent to a lens array rather than along the opposite side of the waveguide. As already noted, a variety of different types of injection features can be implemented depending upon the application and embodiment.

From the above description, it should be apparent that, in at least some embodiments, the present invention involves new types of solar concentrators that allow for efficient and inexpensive conversion of sunlight to electric power. In at least some such solar concentrators, the concentrators collect sunlight from a large upward facing surface having prism facets/injection features and channel the rays via total internal reflection (FIR) within an internal (slab waveguide) region, where they are directed towards the edges of the structure. One or more PV cells are placed at locations where light is allowed to leak for collection and energy conversion. As described above, this can be at one or more ends of the slab region, where the slab terminates and light can be efficiently extracted. Yet in alternate embodiments, PV cells can be placed periodically along the length of the slab waveguide by providing a structure/device that allows for guiding of the light out of the slab waveguide and into the PV cells. In some such embodiments, this involves creation of a sharply curved region of the slab waveguide proximate to the PV cell. One or more simple bends in the slab waveguide/core will break the TIR conditions and can thus simply allow for the extraction of light at several points along a concentrator.

Solar PV systems typically are placed in the outside environment to work, and are in general subject to degradation due to prolonged exposure to weather. In concentrated PV systems, the optical concentrator is exposed to weather, while the PV cell is typically better protected. Recognizing that the PV cell is often the largest single cost element in the system, it is desirable to design a system so that a functional PV cell and associated electronics can be 'recycled' if the optical concentrator is damaged.

In this regard, in at least some of the embodiments of the present invention, the concentrator can be made as a continuous sheet which is cut to the desired length, then attached to a linear PV cell. The nature of a slab waveguide permits the guided light to be efficiently stripped from the guided mode and directed into the PV cell in several ways, for example: (1) by cutting the end surface at an angle, (2) by removing the cladding or providing an index-matching layer between the waveguide and the PV cell, or (3) by introducing a sharp physical curvature or bend into the waveguide, so that the light is incident at less than the critical angle for total internal reflection. These features can be pre-formed into the waveguide sheet, but they can also be incorporated into the mounting for the PV cell, so as to be readily implemented in relation to (for action upon) any region of a waveguide to which they are attached.

Therefore, it is possible to design a linear photovoltaic cell with a mounting that clamps onto the waveguiding concentrator sheet, creating the feature that will strip the guided light and direct it into the photovoltaic cell without the need for accurate alignment. Assuming such a design, it is possible to have a modular concentrated photovoltaic system where one or more photovoltaic cells (and associated electrical connections) can be attached to and/or removed from an optical concentrator in the field, both for the initial installation, and subsequently for maintenance (e.g., if the optical concentrator needs to be replaced due to environmental damage). Further, recognizing that the overall collection efficiency of a waveguide-based concentrator depends on the distance to the PV cell, it is possible to install a large-area concentrator with a single PV cell and subsequently upgrade the overall power output performance of the system by subsequently adding more PV cells.

A slab waveguide typically is a multiple optical mode structure which can guide light without loss as it propagates through the slab. A slab waveguide typically consists of a high index core surrounded by a lower index cladding on the top and/or bottom. Converting light from normal incidence on the face of the slab into light which is propagating within the slab requires some kind of structure for deflecting the light, which will not then act to eject (or allow excessive escaping of) light already trapped within the slab. One way to achieve proper guiding is to provide a localized coupling region with an index comparable to the core. As described, in at least some embodiments, this can involve using a colloidal suspension of high-index, sub-wavelength-sized, particles within a lower index liquid. Bright incident light causes optical trapping; increasing the density of the high index particles and so increasing the overall refractive index where the incoming light accumulates the particles yielding an increase in the average index of refraction. A localized increase in the refractive index allows light that scatters from the suspended particles, or reflects from a nearby optical structure (which is otherwise not interacting with the guided light within the slab), to be trapped within the slab region and guided to the PV cell.

At least some embodiments of the above-described solar energy systems/solar concentrators are suited for the roll-to-roll processing method of manufacture. A roll process produces the lenslets by embossing them onto a layer of low index plastic which covers the higher index slab region. The back surface can be made using a similar process, for the actively aligned version, or using a sandwich of materials, such as a perforated mesh separating a liquid-filled layer from a patterned rear surface. In all cases, the multiple layers of the concentrator can be laid onto one continuous substrate creating a long, flexible product at a very low cost. Alternately the concentrator can be formed onto rigid panels using a more conventional, if more expensive, manufacturing process.

Thus, in at least some embodiments, the present invention involves an overall slab waveguide concentrator geometry using focusing lenses and localized injection features, where either the localized injection features are permanent or alternatively the injection features are reactive (formed in response to incident light), where multiple specific materials and structures can be used for formation of the injection features. The slab waveguide format is extremely compact in comparison to many conventional active or passive concentrator optics. Since material costs are a significant part of the overall system cost, this entails a potential cost savings.

Also, as noted, in the embodiments employing reactive solar concentrators, the reactive nature of the concentrators eliminates the need for the active tracking usually associated with solar concentration. Indeed, such embodiments are distinctive in that no absorption is required. The reacting material can potentially react losslessly, as for example through a change in index. Even if the reacting material does require some absorption, the light which is guided within the slab does not (on average) encounter the reacting material again, and so would experience only a single loss point. The geometries of at least some of these embodiments are attractive in that very high input to output area ratios can be achieved. Although some embodiments will incorporate a lens array and therefore only work with specular light, there is the potential for significantly less loss by avoiding the absorption and remission of photons. The overall geometry maintains the advantage of a high collection area and incorporates a reactive, index-changing material to avoid active tracking.

The highest conversion efficiency photovoltaic cells require concentration of incident sunlight to work with maximum efficiency (typically 100-1000× concentration). However, concentrator optics are fundamentally incapable of efficiently collecting diffuse sunlight onto a small area photovoltaic cell. Therefore, the efficiency of a highly concentrated photovoltaic system drops to nearly zero on cloudy days, whereas non-concentrated photovoltaic systems (such as an amorphous silicon solar panel) substantially maintain their performance. Given these considerations, and further in view of the fact that many solar installations (such as for residential and commercial rooftops) involve limited areas upon which the solar collectors can be implemented, at least some embodiments of the present, invention are intended facilitate achieving the benefits associated with both concentrated PV systems as well as non-concentrated photovoltaic systems by both collecting direct sunlight into a concentrated high-efficiency photovoltaic cell, and also (possibly simultaneously) directing diffuse sunlight into a less efficient photovoltaic cell.

In this regard, at least some embodiments of the present invention involve extracting and concentrating the direct sunlight to the edge of the illuminated area for reception by one or more PV cell(s), while allowing diffuse light to pass through the waveguide for collection by one or more other PV cell(s). Referring again to FIG. 1, light which enters the lens array 8 normally is focused onto the replicated prism facets 26 and coupled into the slab waveguide 18. In some embodiments (e.g., that of FIG. 10), light which enters the lens array 8 at any other angle is focused by the lenslets onto a transparent region of the rear surface of the waveguide, missing the prism facets 26, and is transmitted through the rear surface of the waveguide 24 substantially without attenuation. Therefore, an area-efficient hybrid photovoltaic system can be made by placing a conventional solar panel directly beneath the micro-optic slab concentrator. On cloudless days, most of the energy would be generated by the efficient photovoltaic cell via the concentrator. By comparison, on cloudy days, a smaller total amount of energy, bypassing the slab concentrator, would be generated mostly by the photovoltaic panel.

Each of the above-described embodiments of solar energy systems/solar concentrators are potentially manufacturable at extremely low cost, as compared with the cost of manufacturing conventional PV cell material from amorphous or crystalline Silicon. Due to the compliance with roll-to-roll processing, it is likely that this concentrator design will exist as flexible sheets several meters in length. They could fitted onto roofs or act as tents to provide local power generation for homes or temporary installations. Smaller units can be applicable for the powering of laptop computers or other small electronics. At least some of the above-described embodiments can be made from flexible materials, as each local region is automatically aligned with the incident light. This supports low cost deployment and unconventional uses: for example as tent material or ground cover over non-flat terrain. Although the above description describes physical orientations of various components of solar energy systems relative to one another (e.g., where one component is "above" or "below" another component), these terms are only provided to facilitate description of these embodiments but are not intended to limit the present invention to embodiments satisfying these particular characteristics.

It is specifically intended that the present invention not be limited to the embodiments and illustrations contained herein, but include modified forms of those embodiments including portions of the embodiments and combinations of elements of different embodiments as come within the scope of the following claims.

We claim:

1. A system for capturing solar energy, the system comprising:
   a first lens array having a plurality of lenses;
   a first waveguide component adjacent to the lens array, wherein the waveguide component receives light, and wherein the waveguide component includes an array of prism facets or mirrored facets arranged at discrete locations along at least one surface of the waveguide component; and
   at least one photovoltaic cell positioned so as to receive at least a portion of the light that is directed out of the waveguide component; wherein:
   at least some of the light passing into the waveguide component is restricted from leaving the waveguide component upon being reflected by at least one of the prism facets or mirrored facets, whereby the at least some light restricted from leaving the waveguide component is directed by the waveguide toward the at least one photovoltaic cell,
   the waveguide component includes a first surface and a second surface, the first surface to receive the light after propagation through the lens array and the second surface to receive the light after propagation through at least a portion of the waveguide, and
   the discrete locations of the prism or mirrored facets include a photosensitive material that is local to the discrete locations and is capable of repeatedly responding to changes in the light, such that the light that passes through the first lens array and illuminates the discrete locations of the prisms or mirror facets causes a change in optical properties of the photosensitive material at the discrete locations, thereby changing characteristics of the prism facets or mirrored facets over time as the light received by the waveguide component varies in direction, the photosensitive material including a colloidal suspension of nanoparticles in a fluid, the nanoparticles having a higher index of refraction than the fluid.

2. The system of claim 1, wherein the at least some light is substantially trapped within the waveguide by total internal reflection due to operation of the prism or mirrored facets.

3. The system of claim 1, wherein each of the prism or mirrored facets is aligned with a respective one of the lenses of the lens array.

4. The system of claim 1, wherein the lens array includes an outer surface upon which the light received by the waveguide is initially incident prior to being received by the waveguide, and an inner surface opposed to the outer surface, the inner surface extending alongside the waveguide component.

5. The system of claim 1, wherein the lenses of the lens array serve to focus the light toward the prism or mirrored facets of the waveguide component.

6. The system of claim 1, wherein the waveguide component includes a first surface, a second surface and an intermediate light conductive structure in between the first and second surfaces, wherein a cladding layer positioned between the first surface of the waveguide component and the inner surface of the lens array and the cladding layer having a lower index of refraction compared to the intermediate light conductive structure.

7. The system of claim 6, wherein the prism or mirrored facets are formed along the second surface.

8. The system of claim 1, wherein the photosensitive material operates to repeatedly sense and respond to changes in electric fields of portions of the light, by drawing in high dielectric index particles so as to achieve optical trapping.

9. The system of claim 1, wherein the waveguide component receives the light from the lens array after the light has previously arrived at the lens array.

10. The system of claim 9, wherein the light arrives at the lens array from an external location.

11. The system of claim 9, wherein the light arrives at the lens array after first passing through the waveguide component.

12. The system of claim 11, wherein the lens array includes a mirrored surface for reflecting the light arriving at the lens array back toward the waveguide component.

13. The system of claim 12, wherein the mirrored surface is a dichroic surface by which at least a portion of additional light arriving at the lens array is able to proceed to either a diffuse light receiver or another waveguide component.

14. The system of claim 1, further comprising a second lens array, wherein the waveguide component is positioned in between the first lens array and the second lens array.

15. The system of claim 14, wherein the light received by the waveguide component is received after having first passed through the first lens array and having additionally been reflected by the second lens array back toward the waveguide component.

16. The system of claim 14, wherein the waveguide component is laterally shiftable relative to the first and second lens arrays.

17. The system of claim 1, wherein a first of the at least one photovoltaic cell is positioned along a longitudinal edge of the waveguide component.

18. The system of claim 1, further comprising one or more of a folding prism, a curved mirror, or a reflector positioned along at least one longitudinal edge of the waveguide component.

19. The system of claim 18, wherein the at least some of the light directed toward the at least one photovoltaic cell proceeds to the at least one photovoltaic cell only after being redirected by one or more of the folding prism, the curved mirror, or the reflector.

20. The system of claim 18, wherein a first of the at least one photovoltaic cell also receives additional light from another adjacent waveguide component.

21. The system of claim 1, wherein a first portion of the at least some light restricted from leaving the waveguide component is directed by the waveguide component to and through a first edge surface of the waveguide component and thereby coupled into a first of the at least one photovoltaic cell.

22. The system of claim 21, wherein the first edge surface includes a first dichroic mirror allowing for transmission of the first portion of the at least some light corresponding to a first light spectrum portion to pass out of the waveguide component for receipt by the first photovoltaic cell.

23. The system of claim 22, wherein the waveguide component includes a second edge surface having a second dichroic mirror allowing for transmission of a second portion of the at least some light corresponding to a second light spectrum portion to pass out of the waveguide component for receipt by a second of the at least one photovoltaic cell.

24. The system of claim 1,
wherein the first waveguide component includes first and second longitudinal surfaces that are substantially opposed to one another, wherein the first longitudinal surface extends alongside the lens array,
wherein the waveguide component further includes first and second side edge surfaces each extending between the first and second longitudinal surfaces and further extending away from the lens array, and
wherein the waveguide component further includes first and second end edge surfaces each extending between the longitudinal surfaces and also between the side edge surfaces.

25. The system of claim 24, wherein a first dichroic mirror is formed on the first end edge surface and a second dichroic mirror is formed on the second end edge surface, wherein the first dichroic mirror allows a first portion of the at least some light to pass out of the waveguide component for receipt by a first of the at least one photovoltaic cell but precludes a second portion of the at least some light to pass out of the waveguide component, and wherein the second dichroic mirror allows the second portion to pass out of the waveguide component for receipt by a second of the at least one photovoltaic cell but precludes the first portion to pass out of the waveguide component.

26. A system for capturing solar energy, the system comprising:
a lens array having a plurality of lenses;
a waveguide component adjacent to the lens array, wherein the waveguide component receives light, wherein the waveguide component includes an array of prism facets or mirrored facets arranged at discrete locations along at least one surface of the waveguide component; and
wherein at least some of the light passing into the waveguide component is restricted from leaving the waveguide component upon being reflected by at least one of the prism facets or mirrored facets, and
wherein discrete locations of the prisms or mirrored facets include a photosensitive material that is local to the discrete locations and is capable of repeatedly responding to changes in the light such that the light that passes through the lens array and illuminates the discrete locations of the prisms or mirror facets causes a change in optical properties of the photosensitive material at the discrete locations, thereby changing characteristics of the prism facets or mirrored facets over time as the light received by the waveguide component varies in direction and coupling a majority of light incident upon the lens array into the waveguide, the photosensitive material including a colloidal suspension of nanoparticles in a fluid, the nanoparticles having a higher index of refraction than the fluid.

27. The system of claim 26, wherein the at least some light is substantially trapped within the waveguide by total internal reflection due to operation of the prism facets or mirrored facets.

28. The system of claim 26, wherein each of the prism facets or mirrored facets are aligned with a respective one of the lenses of the lens array.

29. The system of claim 26, wherein the lens array includes an outer surface upon which the light received by the waveguide is initially incident prior to being received by the waveguide, and an inner surface opposed to the outer surface, the inner surface extending alongside the waveguide component.

30. The system of claim 26, wherein the lenses of the lens array serve to focus the light toward the prism facets or mirrored facets of the waveguide component.

31. The system of claim 26, wherein the waveguide component includes a first surface, a second surface and an intermediate light conductive structure in between the first and second surfaces, wherein a cladding layer positioned between the first surface of the waveguide component and the inner surface of the lens array and the cladding layer having a lower index of refraction compared to the intermediate light conductive structure.

32. The system of claim 26, wherein the photosensitive material operates to repeatedly sense and respond to changes in intensity of portions of the light, by drawing in high dielectric index particles so as to achieve optical trapping.

33. The system of claim 26, further comprising a second lens array, wherein the waveguide component is positioned in between the lens array and the second lens array.

34. The system of claim 26, wherein a first photovoltaic cell is positioned along a longitudinal edge of the waveguide component.

35. The system of claim 34, wherein a first portion of the at least some light restricted from leaving the waveguide component is directed by the waveguide component to and through a first edge surface of the waveguide component and thereby coupled into a first of at least one photovoltaic cell.

36. The system of claim 26, wherein the waveguide component includes first and second longitudinal surfaces that are substantially opposed to one another, wherein the first longitudinal surface extends alongside the lens array, wherein the waveguide component further includes first and second side edge surfaces each extending between the first and second longitudinal surfaces and further extending away from the lens array, and wherein the waveguide component further includes first and second end edge surfaces each extending between the longitudinal surfaces and also between the side edge surfaces.

* * * * *